United States Patent
Chang et al.

(10) Patent No.: US 11,257,819 B2
(45) Date of Patent: Feb. 22, 2022

(54) SEMICONDUCTOR DEVICE

(71) Applicant: TAIWAN SEMICONDUCTOR MANUFACTURING CO., LTD., Hsinchu (TW)

(72) Inventors: Chia-Yuan Chang, Hsinchu (TW); Xiong-Fei Yu, Hsinchu (TW); Hui-Cheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 15 days.

(21) Appl. No.: 16/845,012

(22) Filed: Apr. 9, 2020

(65) Prior Publication Data

US 2020/0243524 A1    Jul. 30, 2020

Related U.S. Application Data

(63) Continuation of application No. 15/000,981, filed on Jan. 19, 2016, now Pat. No. 10,622,356.

(51) Int. Cl.
*H01L 27/092* (2006.01)
*H01L 21/8238* (2006.01)
(Continued)

(52) U.S. Cl.
CPC .......... *H01L 27/0924* (2013.01); *B82Y 10/00* (2013.01); *H01L 21/02532* (2013.01);
(Continued)

(58) Field of Classification Search
CPC ....... H01L 21/28079–28088; H01L 21/28061; H01L 29/7853–2029/7858
See application file for complete search history.

(56) References Cited

U.S. PATENT DOCUMENTS

| 9,362,179 B1 | 6/2016 | Cheng |
| 2007/0090416 A1 | 4/2007 | Doyle |

(Continued)

FOREIGN PATENT DOCUMENTS

| CN | 101364600 A | 2/2009 |
| CN | 102201435 A | 9/2011 |

(Continued)

OTHER PUBLICATIONS

H. Rusty Harris, et al., "Band-Engineered Low PMOS VT with High-K/Metal Gates Featured in a Dual Channel CMOS Integration Scheme", 2007 Symposium on VSLI Technology Digest of Technical Papers, Jun. 12, 2007.

*Primary Examiner* — Moazzam Hossain
*Assistant Examiner* — Stanetta D Isaac
(74) *Attorney, Agent, or Firm* — Maschoff Brennan

(57) ABSTRACT

A semiconductor device includes first and second nanowire structures, first and second annular hafnium oxide layers, first and second annular cap layers, and first and second metal gate electrodes. The first and second nanowire structures are suspended over a substrate and respectively have an n-channel region and a p-channel region. The first and second annular hafnium oxide layers encircle the n-channel region and the p-channel region, respectively. The first and second annular cap layers encircle the first and second annular hafnium oxide layers, respectively. The first and second annular cap layers are made of a same material that is lanthanum oxide, yttrium oxide, or strontium oxide. The first and second metal gate electrodes encircle the first and second annular cap layers, respectively. The first and second metal gate electrodes have a same metal composition.

20 Claims, 24 Drawing Sheets

(51) Int. Cl.
  *H01L 29/66* (2006.01)
  *B82Y 10/00* (2011.01)
  *H01L 29/423* (2006.01)
  *H01L 29/775* (2006.01)
  *H01L 29/06* (2006.01)
  *H01L 29/786* (2006.01)
  *H01L 21/02* (2006.01)
  *H01L 21/3115* (2006.01)
  *H01L 21/8258* (2006.01)
  *H01L 29/161* (2006.01)
  *H01L 29/49* (2006.01)
  *H01L 29/51* (2006.01)
  *H01L 29/78* (2006.01)
  *H01L 29/20* (2006.01)

(52) U.S. Cl.
  CPC .... *H01L 21/02538* (2013.01); *H01L 21/3115* (2013.01); *H01L 21/8258* (2013.01); *H01L 21/823807* (2013.01); *H01L 29/068* (2013.01); *H01L 29/0673* (2013.01); *H01L 29/161* (2013.01); *H01L 29/42392* (2013.01); *H01L 29/4966* (2013.01); *H01L 29/511* (2013.01); *H01L 29/517* (2013.01); *H01L 29/66439* (2013.01); *H01L 29/66545* (2013.01); *H01L 29/775* (2013.01); *H01L 29/78696* (2013.01); *H01L 21/823821* (2013.01); *H01L 21/823828* (2013.01); *H01L 29/20* (2013.01); *H01L 29/66469* (2013.01); *H01L 29/7848* (2013.01)

(56) References Cited

U.S. PATENT DOCUMENTS

| | | |
|---|---|---|
| 2008/0217695 A1 | 9/2008 | Atanackovic |
| 2009/0298245 A1 | 12/2009 | Doris et al. |
| 2010/0044798 A1 | 2/2010 | Hooker et al. |
| 2010/0052066 A1 | 3/2010 | Yu |
| 2010/0078653 A1 | 4/2010 | Griebenow |
| 2014/0065802 A1 | 3/2014 | Chang |
| 2014/0124872 A1 | 5/2014 | Kim |
| 2014/0319623 A1* | 10/2014 | Tsai ............... H01L 29/40114 257/401 |
| 2015/0187770 A1 | 7/2015 | Mehrotra |
| 2015/0255295 A1 | 9/2015 | Jacob |
| 2015/0255457 A1 | 9/2015 | Loubet et al. |

FOREIGN PATENT DOCUMENTS

| | | |
|---|---|---|
| CN | 103579111 A | 2/2014 |
| CN | 104377197 A | 2/2015 |

* cited by examiner

SEMICONDUCTOR DEVICE

CROSS-REFERENCE TO RELATED APPLICATION

This application is a continuation application of U.S. patent application Ser. No. 15/000,981, filed Jan. 19, 2016, now U.S. Pat. No. 10,622,356, issued Apr. 14, 2020, which is incorporated herein by reference in its entirety.

BACKGROUND

Complementary metal oxide semiconductor (CMOS) technology, formed by establishing an n-type field effect transistor and a p-type field effect transistor on a semiconductor device, is used in the IC manufacture. Technological advances in IC materials and design have produced generations of ICs where each generation has smaller and more complex circuits than the previous generation. As a result, the n-type field effect transistor and the p-type field effect transistor on the semiconductor device are scaled down as well.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
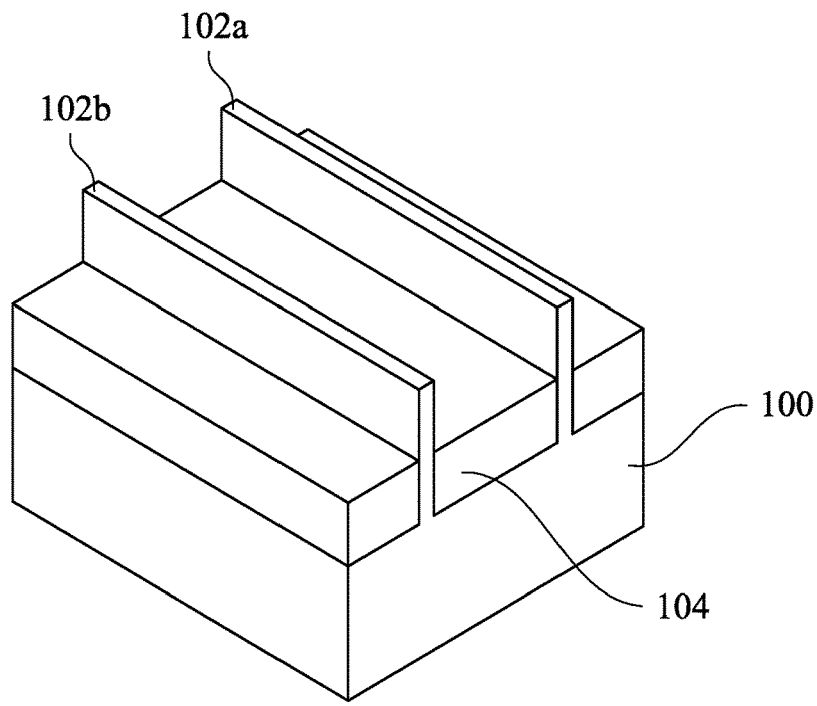
FIG. 1 to FIG. 12 illustrate different steps of a method of forming a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the some embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 to FIG. 12 illustrate different steps of a method of forming a semiconductor device according to some embodiments of the present disclosure. As shown in FIG. 1, a plurality of fins 102a and 102b are formed on a substrate 100. In some embodiments, the substrate 100 includes a bulk silicon substrate. In some embodiments, the substrate 100 may be silicon in a crystalline structure. In some other embodiments, the substrate 100 may include other elementary semiconductors, such as germanium, or include a compound semiconductor, such as silicon carbide, gallium arsenide, indium arsenide, or indium phosphide. In yet some other embodiments, the substrate 100 includes a silicon-on-insulator (SOI) substrate. The SOI substrate may be fabricated using separation by implantation of oxygen, wafer bonding, and/or other suitable methods.

The fins 102a and 102b extend from the substrate 100. The fins 102a and 102b may be fabricated by using suitable processes, such as photolithography and etching. In some embodiments, the fins 102a and 102b may be etched from the substrate 100 by using dry etching or a plasma process. Thereafter, an isolation dielectric 104 is formed to fill lower portions of trenches between the fins 102a and 102b as shallow trench isolation (STI). The isolation dielectric 104 may include any suitable dielectric material, such as silicon oxide. The method of forming the isolation dielectric 104 may include depositing an isolation dielectric 104 on the substrate 100 to cover the fins 102a and 102b, optionally performing a planarization process to remove the excess isolation dielectric 104 outside of the trenches, and then performing an etching process on the isolation dielectric 104 until upper portions of the fins 102a and 102b are exposed.

Figure 2:
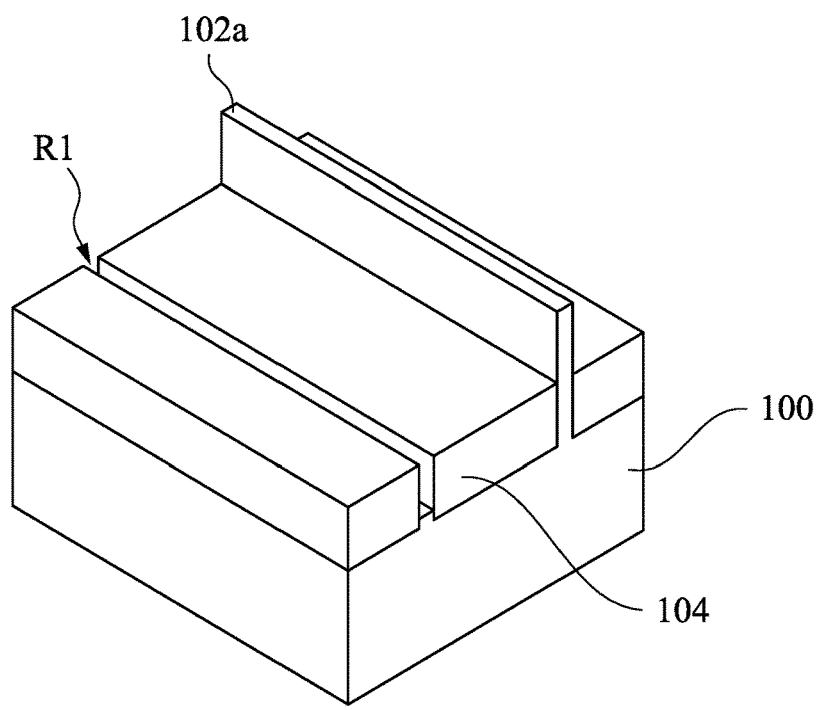

As shown in FIG. 2, the fin 102b (shown in FIG. 1) is removed to form a recess R1 on the substrate 100. During removal of the fin 102b, the fin 102a may be protected by a mask. The removal of the fin 102b may be performed by reactive ion etching (RIE) or by any other suitable removal process. In some embodiments, the removal of the fin 102b may be performed under a pressure in a range from about 1 mTorr to about 1000 mTorr, a power in a range from about 50 W to about 1000 W, a bias voltage in a range from about 20 V to about 500 V, at a temperature in a range from about 40° C. to about 60° C., and/or using HBr and/or $Cl_2$ as etching gases.

Figure 3:
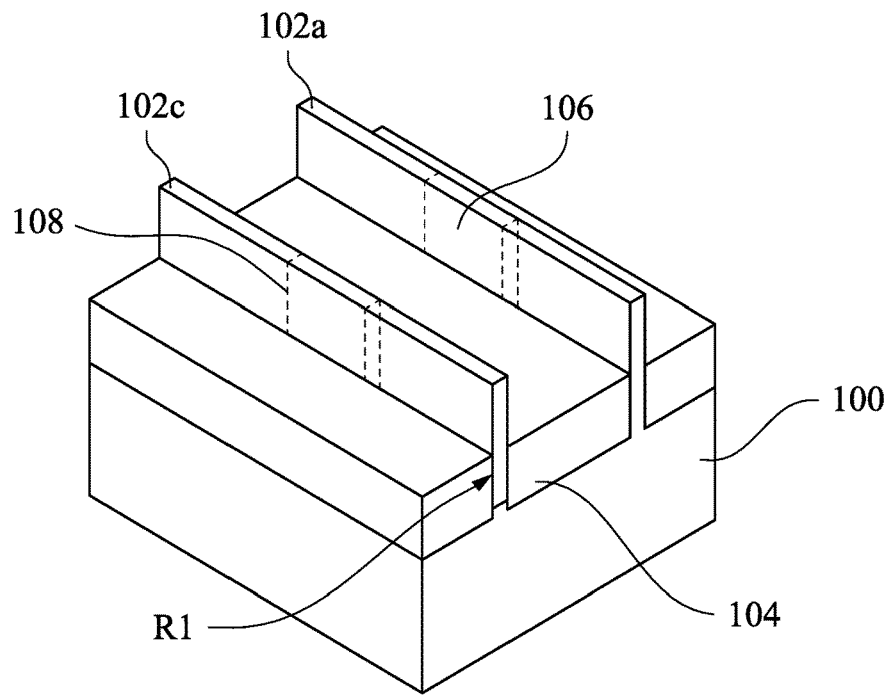

As shown in FIG. 3, an epitaxial fin 102c having a material different from the fin 102a may be formed in the recess R1. A portion of the fin 102a may serve as an n-channel 106 for an n-type fin-type field effect transistor (FinFET). A portion of the epitaxial fin 102c may serve as a p-channel 108 for a p-type FinFET. Since the fin 102a and the epitaxial fin 102c are made of different materials, the n-channel 106 and the p-channel 108 are made of different materials. In particular, the n-channel 106 may be made of silicon, while the p-channel 108 may be made of silicon germanium. Since germanium shifts the valence band of the p-channel 108, the germanium concentration (or the germanium atomic percentage) of the p-channel 108 may be controlled to tune the threshold voltage of the p-type FinFET. In some embodiments, the epitaxial fin 102c having the p-channel 108 may be epi-grown by a low-pressure chemical vapor deposition (LPCVD) process. The LPCVD process may be performed at a temperature in a range from about 400° C. to about 800° C., under a pressure in a range from about 1 to about 200 Torr, and using at least one silicon-containing gas, such as $SiH_4$, and at least one germanium-containing gas, such as $GeH_4$, as reaction gases. Control of the germanium concentration may be implemented by the ratio of the flow rate of the germanium-containing gas to the flow rate of the silicon-containing gas during epitaxy growth of the p-channel 108.

In some embodiments, the fin 102a may be removed to form a recess, and then an III-V compound semiconductor material may be formed on the recess through epitaxial growth, so as to form the n-channel 106. The III-V compound semiconductor material may include, but is not limited to, InAs, AlAs, GaAs, InP, GaN, InGaAs, InAlAs, GaSb, AlSb, AlP, GaP, or the like.

Figure 4:
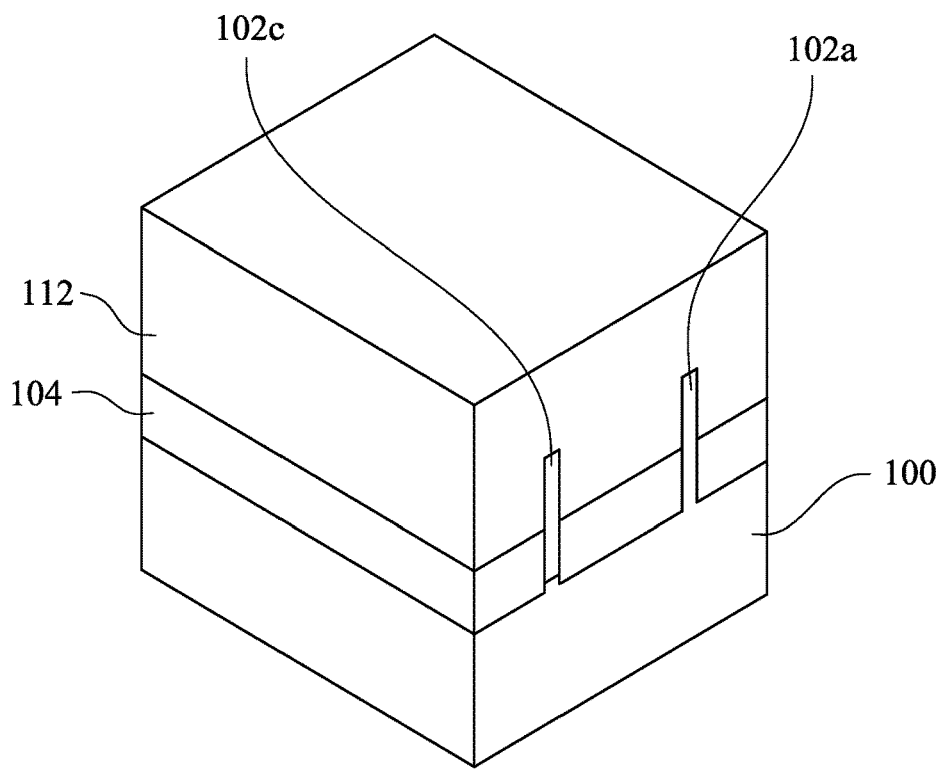

As shown in FIG. 4, a dummy gate material layer 112 is formed on the fin 102a and the epitaxial fin 102c. The dummy gate material layer 112 may include poly silicon. The dummy gate material layer 112 can be formed by a deposition process, such as a chemical vapor deposition (CVD) process.

Figure 5:
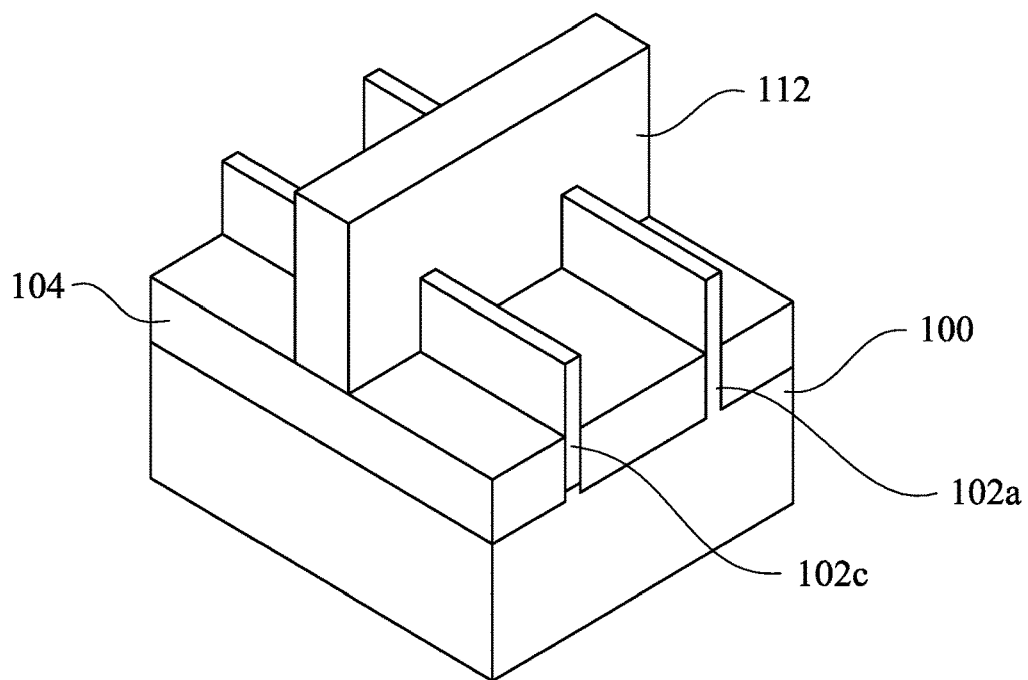

As shown in FIG. 5, the dummy gate material layer 112 is patterned to form a structure crossing portions the fin 102a and the epitaxial fin 102c. Other portions of the fin 102a and the expitaxial fin 102c beside the dummy gate material layer 112 are exposed. The patterning step includes performing photolithography and etching processes.

Figure 6:
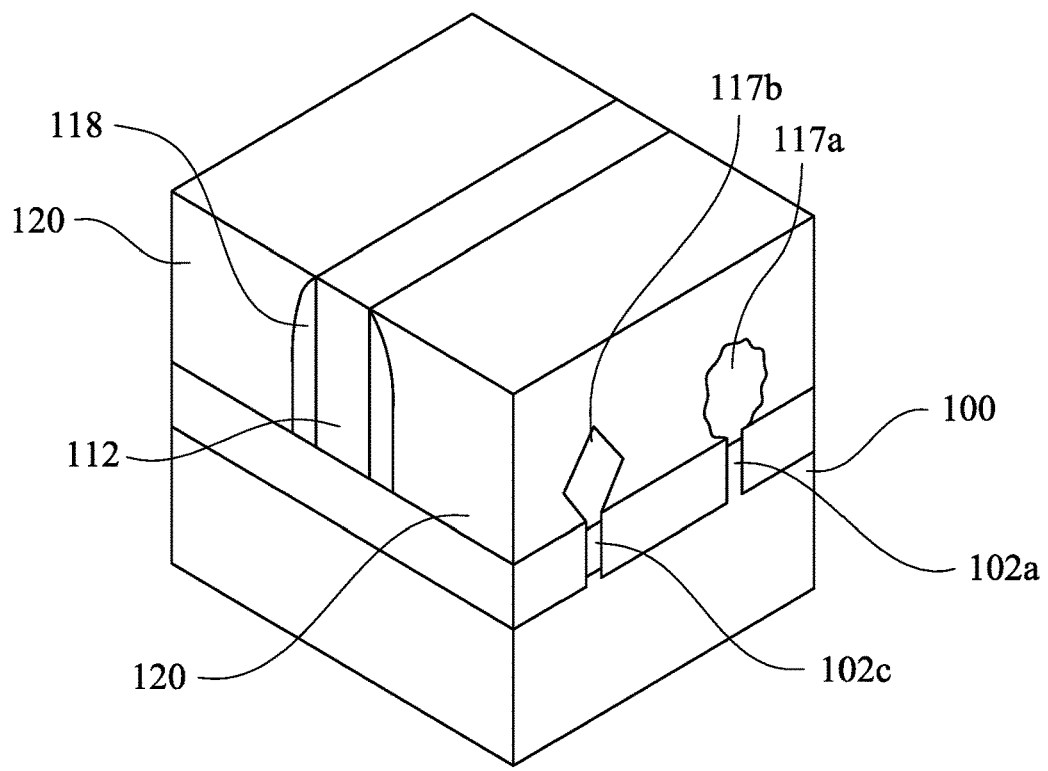

As shown in FIG. 6, spacers 118 are formed on opposite sidewalls of the dummy gate material layer 112. The method of forming the spacers 118 includes forming a dielectric layer on the substrate 100 and then performing an etching process to remove a portion of the dielectric layer. First source/drain regions 117a may be then formed on the fin 102a. For example, the first source/drain regions 117a may include source/drain stressors, and formation of the source/drain stressors includes forming source/drain recesses in the fin 102a and adjacent to the spacers 118, forming a seed layer in the source/drain recesses, forming a relaxed epitaxial layer on the seed layer and in the source/drain recesses, and forming an epitaxial layer on the relaxed epitaxial layer and in the source/drain recesses, so that the seed layer, the relaxed epitaxial layer and the epitaxial layer form the source/drain stressors. Second source/drain regions 117b may be formed on the epitaxial fin 102c as well. For example, the second source/drain regions 117b may include source/drain stressors, and formation of the source/drain stressors includes forming source/drain recesses in the epitaxial fin 102c and adjacent to the spacers 118, forming a seed layer in the source/drain recesses, forming a relaxed epitaxial layer on the seed layer and in the source/drain recesses, and forming an epitaxial layer on the relaxed epitaxial layer and in the source/drain recesses, so that the seed layer, the relaxed epitaxial layer and the epitaxial layer form the source/drain stressors. In some embodiments, the first source/drain regions 117a may include stressors including, for example, SiP, SiC or SiCP, which is able to induce tensile strain to the n-type channel of the fin 102a; and the second source/drain region 117b may include stressors including SiGe, which is able to induce compress strain to the p-type channel of the epitaxial fin 102c. In some embodiments, the p-type channel of the epitaxial fin 102c includes a germanium concentration lower than that of the second source/drain regions 117b when the p-type channel of the epitaxial fin 102c and the second source/drain region 117b are made of SiGe.

An interlayer dielectric (ILD) layer 120 is formed on the substrate 100 to cover the dummy gate material layer 112, the fin 102a, the epitaxial fin 102c, the first source/drain regions 117a, and the second source/drain regions 117b. The ILD layer 120 may include silicon oxide, silicon nitride, silicon oxynitride, silicon carbide, a low-dielectric constant dielectric material, or combinations thereof. The ILD layer 120 can be formed by a deposition process, such as a CVD process. Afterwards, a portion of the ILD layer 120 is removed to expose a top surface of the dummy gate material layer 112. The removing step may include performing a chemical-mechanical polishing (CMP) process.

Figure 7:
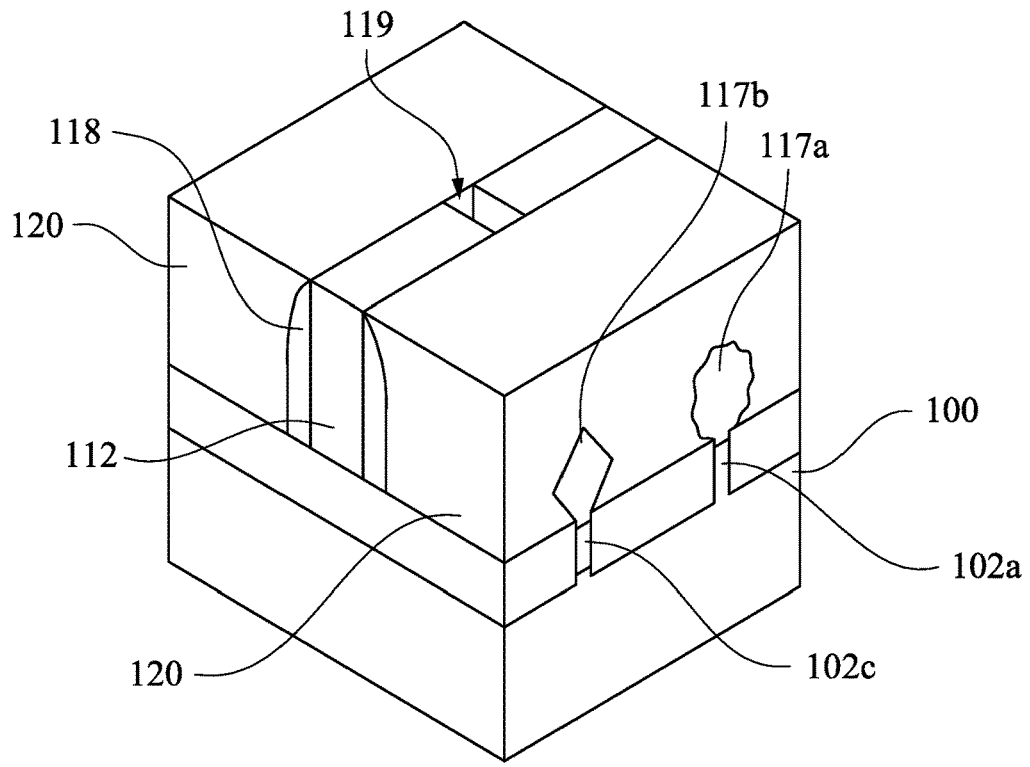

As shown in FIG. 7, at least a portion of the dummy gate material layer 112 between the fin 102a and the epitaxial fin 102c is removed to form a recess 119 by using suitable processes, such as photolithography and etching. Formation of the recess 119 may be performed by reactive ion etching (RIE) or by any other suitable removal process. During the formation of the recess 119, other portions of the dummy gate material layer 112 and the ILD layer 120 may be protected by a mask, such as a photoresist mask. After the formation of the recess 119, the mask can be removed by ashing, stripping, or other suitable techniques.

Figure 8:
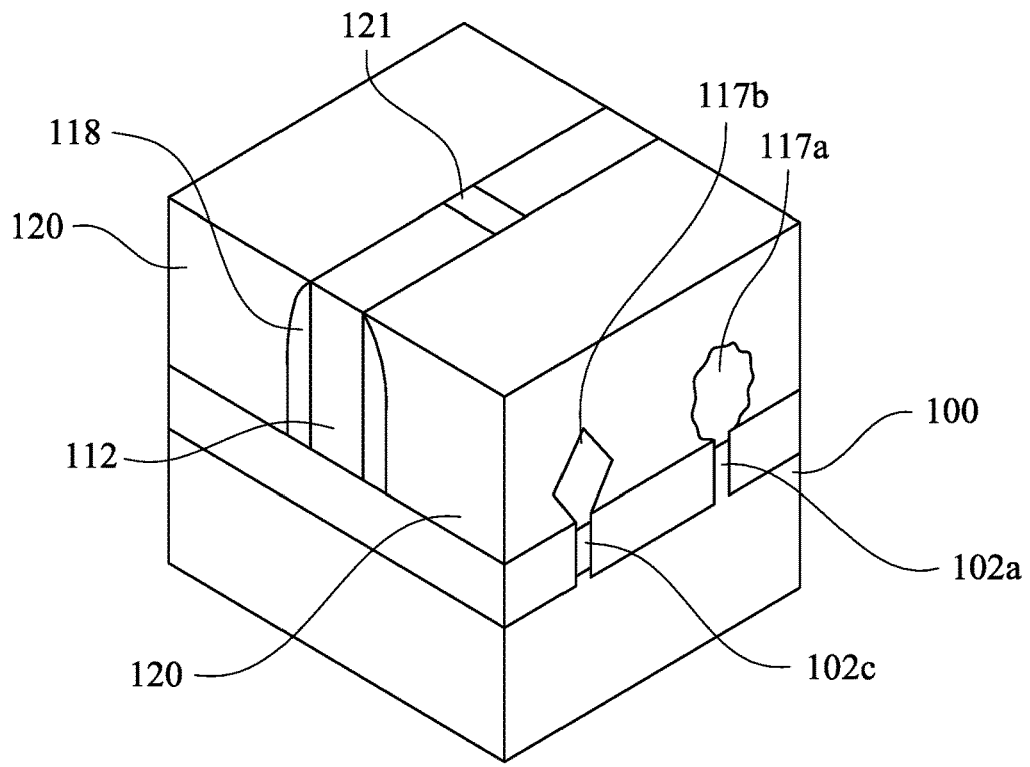

As shown in FIG. 8, an isolation structure 121 is formed in the recess 119. The isolation structure 121 may include oxide, such as phospho-silicate glass (PSG), boro-silicate glass (BSG), boron-doped phospho-silicate glass (BPSG), tetraethyl orthosilicate (TEOS), or the like. The isolation structure 121 may be formed by a deposition process and then removing the excess isolation structure 121 outside of the recess 119 by CMP.

Figure 9:
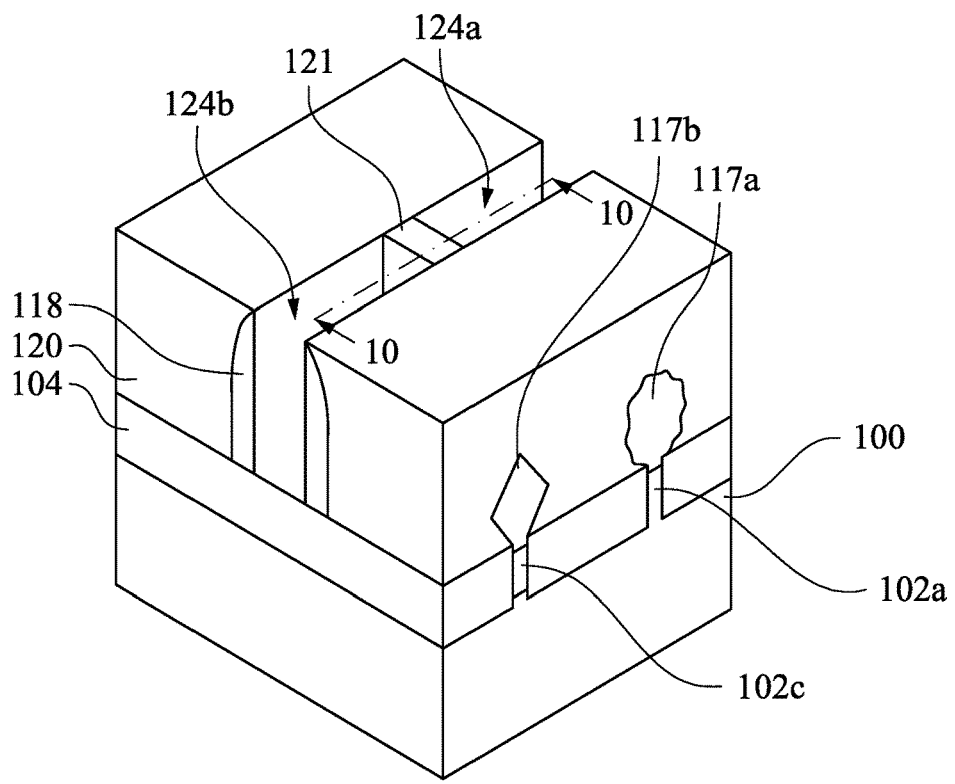
Figure 10:
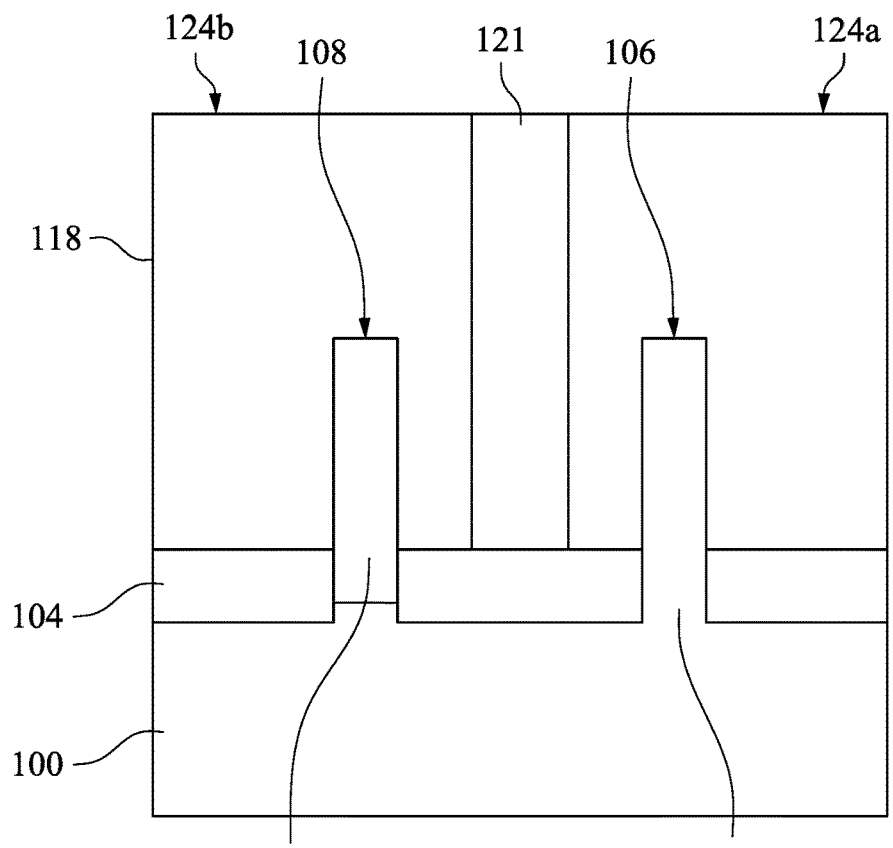

As shown in FIG. 9, the remaining dummy gate material layer 112 is removed by using suitable processes, such as wet etching. After removal of the remaining dummy gate material layer 112, a first recess 124a and a second recess 124b are formed between the spacers 118. The isolation structure 121 is present between the first recess 124a and the second recess 124b. The isolation structure 121 may be a plug which is surrounded by the spacers 118, the first recess 124a, and the second recess 124b. Reference is made to FIG. 10, which is a cross-sectional view taken along line 10 of FIG. 9. As shown in FIG. 10, the isolation structure 121 is present between the fin 102a and the epitaxial fin 102c, so as to define an insulation area between gate electrodes respectively formed on the fin 102a and the epitaxial fin 102c in a subsequent step.

Figure 11:
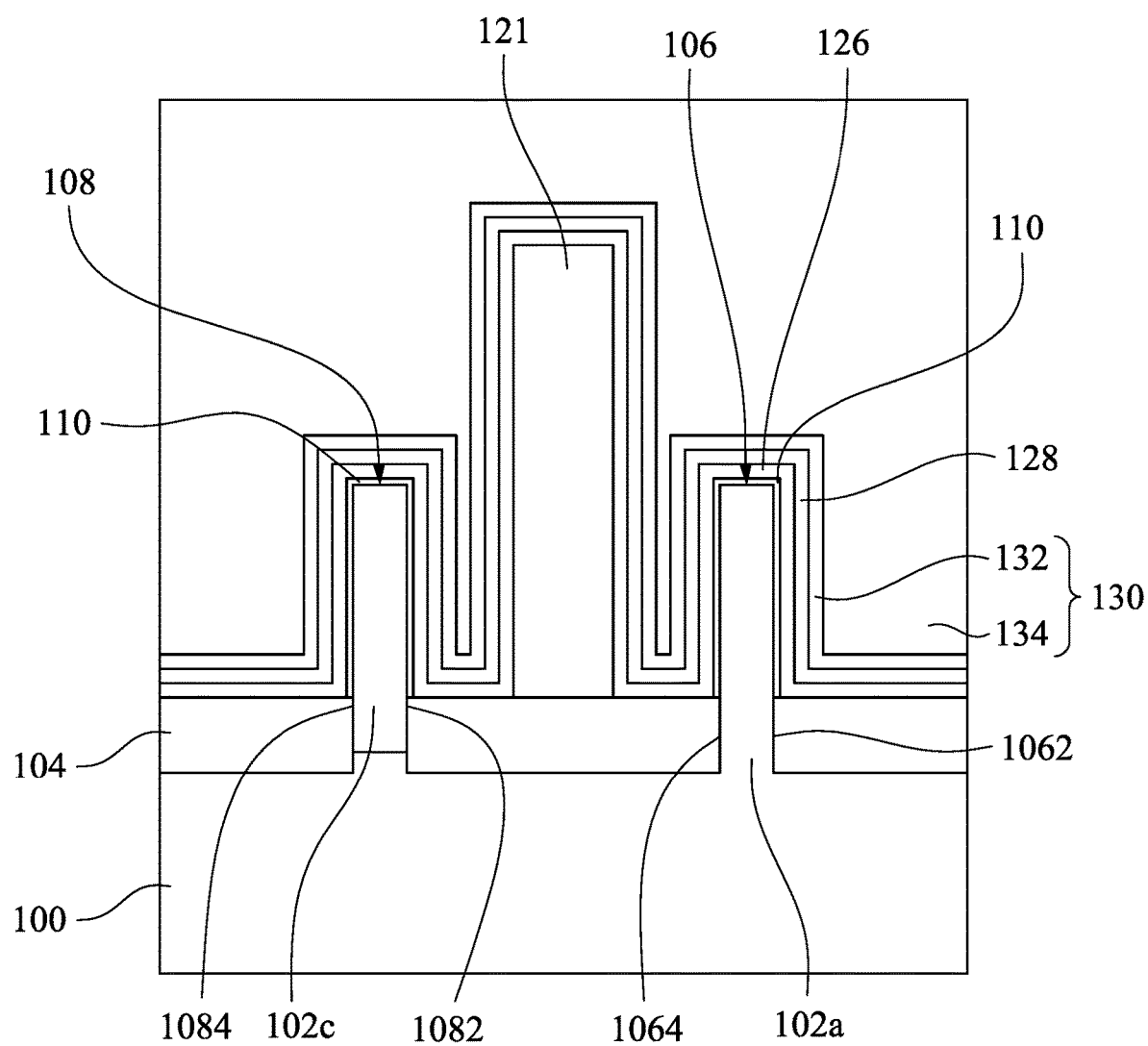

As shown in FIG. 11, an interfacial layer 110 is formed on the fin 102a and epitaxial fin 102c by using, for example, a thermal process. The interfacial layer 110 may include silicon oxide. Then, a gate dielectric layer 126 is formed on the substrate 100 and covers the interfacial layer 110, the fin 102a, the epitaxial fin 102c and the isolation structure 121 by using, for example, a deposition process, such as an atomic layer deposition (ALD) process, a CVD process, a physical vapor deposition process, or a sputter deposition process. Thereafter, a cap layer 128 is formed on the gate dielectric layer 126 by using, for example, doping a dopant to the gate dielectric layer 126 to form an oxide layer thereon, which serves as the cap layer 128. Afterwards, a work function metal layer 132 is formed on the cap layer 128 by using, for example, a deposition process, such as an ALD process, a CVD process, a PVD process or a sputter deposition process. Then, a metal gate 134 is formed on the work function metal layer 132 by using, for example, a deposition process, such as an ALD process, a CVD process, a PVD process or a sputter deposition process. The work function metal layer 132 and the metal gate 134 serve as the metal gate electrode 130 together.

Figure 12:
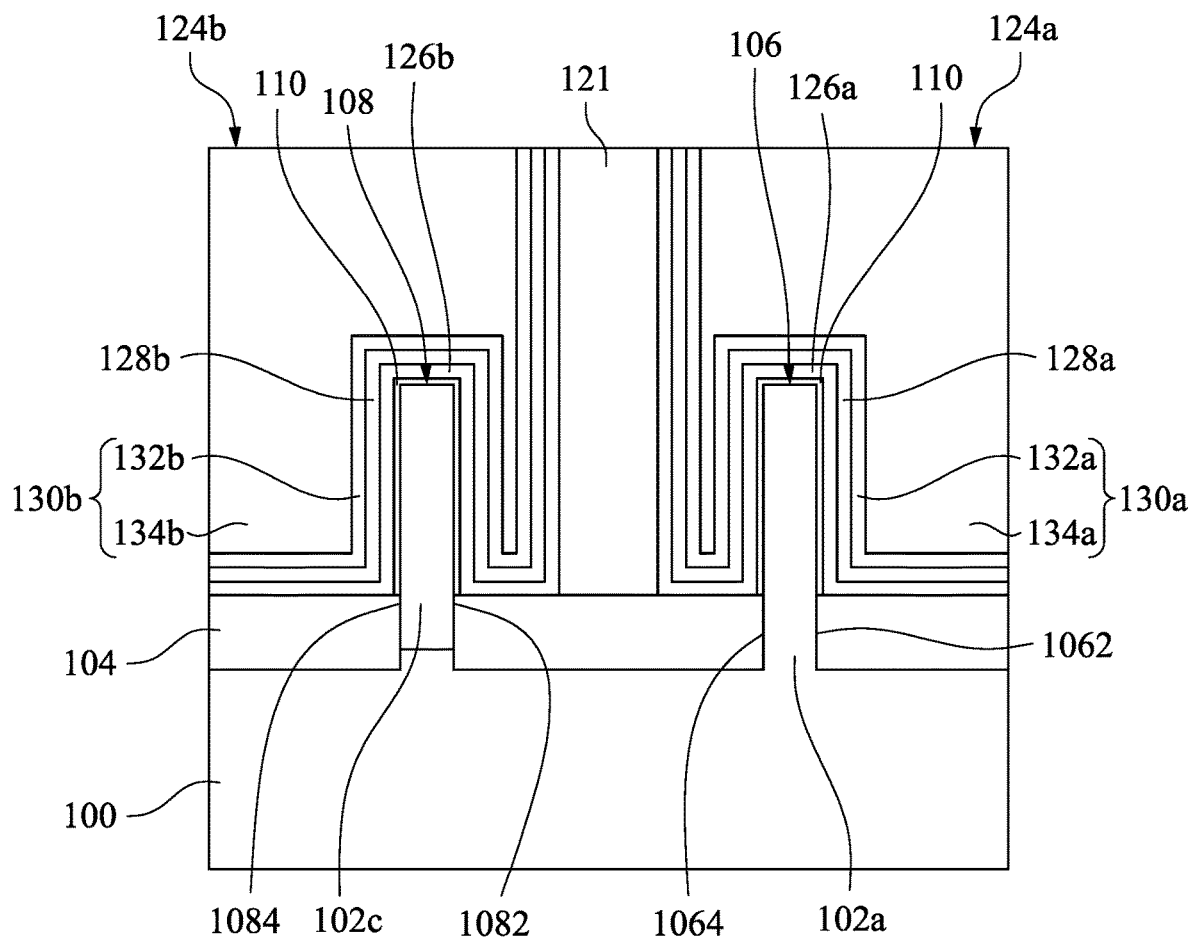

As shown in FIG. 12, portions of the gate dielectric layer 126, the cap layer 128, and the metal gate electrode 130 are removed to expose a top surface of the isolation structure 121, so as to form first and second dielectric layers 126a and 126b separated from each other, first and second cap layers 128a and 128b separated from each other, and first and second metal gate electrodes 130a and 130b separated from each other. The removing step may include performing a CMP process. In a greater detail, the first gate dielectric layer 126a and a second gate dielectric layer 126b are present in the first recess 124a and the second recess 124b respectively and are separated by the isolation structure 121. The first gate dielectric layer 126a and the second gate dielectric layer 126b are respectively present on the n-channel 106 of the fin 102a and the p-channel 108 of the epitaxial fin 102c. The first gate dielectric layer 126a and the second gate dielectric layer 126b are respectively present on portions of the interfacial layer 110 respectively covering the fin 102a and the epitaxial fin 102c. In a greater detail, the first gate dielectric layer 126a is present on at least opposite sidewalls 1062 and 1064 of the n-channel 106, and the second gate dielectric layer 126b is present on at least opposite sidewalls 1082 and 1084 of the p-channel 108. In some embodiments, the n-channel 106 and the p-channel 108 are non-planar and are fin-shaped, and the first and second gate dielectric layers 126a and 126b respectively wrap the non-planar n-channel 106 and p-channel 108. At least one of the first and second gate dielectric layers 126a and 126b includes a high-k material with a high dielectric constant. The high-k material may include hafnium oxide ($HfO_2$), hafnium silicon oxide ($HfSiO_4$), hafnium silicon oxynitride (HfSiON), or other suitable material. In some embodiments, the first gate dielectric layer 126a and the second gate dielectric layer 126b are made of substantially the same high-k dielectric material. For example, the first gate dielectric layer 126a and the second gate dielectric layer 126b may be made of hafnium oxide ($HfO_2$).

The first cap layer 128a and the second cap layer 128b are respectively present on the first and second gate dielectric layers 126a and 126b. The first metal gate electrode 130a and the second metal gate electrode 130b are respectively present on the first and second cap layers 128a and 128b. More particularly, the first cap layer 128a is present between the first gate dielectric layer 126a and the first metal gate electrode 130a, and the second cap layer 128b is present between the second gate dielectric layer 126b and the second metal gate electrode 130b. The first and second cap layers 128a and 128b are respectively in contact with the first and second metal gate electrodes 130a and 130b.

In some embodiments, the first cap layer 128a is made of a material that is able to decrease an effective work function of the first metal gate electrode 130a, so that the threshold voltage of the n-type FinFET may be tuned by the first cap layer 128a. In particular, the first cap layer 128a may include a rare earth compound, strontium, or combinations thereof. The rare earth compound may be, for example, lanthanum (La), yttrium (Y), dysprosium (Dy), ytterbium (Yb), lutetium (Lu), scandium (Sc), cerium (Ce), praseodymium (Pr), neodymium (Nd), europium (Eu), gadolinium (Gd), terbium (Tb), or erbium (Er). For example, the first cap layer 128a may be made of lanthanum oxide, yttrium oxide, strontium oxide or combinations thereof. Formation of the first cap layer 128a includes doping a dopant including a material, such as lanthanum, yttrium, strontium or combinations thereof, to the first gate dielectric layer 126a, thereby forming a layer of lanthanum oxide, yttrium oxide, strontium oxide or combinations thereof on the first gate dielectric layer 126a to serve as the first cap layer 128a. The dopant dose of lanthanum, yttrium, strontium or combinations thereof may affect the effective work function of the first metal gate electrode 130a, and therefore, the threshold voltage of the n-type FinFET may be tuned by the dopant dose of lanthanum, yttrium, strontium or combinations thereof.

In some embodiments, the second cap layer 128b is made of a material that is able to decrease an effective work function of the second metal gate electrode 130b formed thereon, so that the threshold voltage of the p-type FinFET may be tuned by the second cap layer 128b. In particular, the second cap layer 128b may include a rare earth compound, strontium, or combinations thereof. The rare earth compound may be, for example, lanthanum(La), yttrium (Y), dysprosium (Dy), ytterbium (Yb), lutetium (Lu), scandium (Sc), cerium (Ce), praseodymium (Pr), neodymium (Nd), europium (Eu), gadolinium (Gd), terbium (Tb), or erbium (Er). For example, the second cap layer 128b may be made of lanthanum oxide, yttrium oxide, strontium oxide or combinations thereof. Formation of the second cap layer 128b includes doping a dopant including a material, such as lanthanum, yttrium, strontium or combinations thereof, to the second gate dielectric layer 126b, thereby forming a layer of lanthanum oxide, yttrium oxide, strontium oxide or combinations thereof on the second gate dielectric layer 126b to serve as the second cap layer 128b. The dopant dose of lanthanum, yttrium, strontium or combinations thereof may affect the effective work function of the second metal gate electrode 130b, and therefore, the threshold voltage of the p-type FinFET may be tuned by the dopant dose of lanthanum, yttrium, strontium or combinations thereof. In some embodiments, the first gate dielectric layer 126a and the second gate dielectric layer 126b are doped with substantially the same dopant, so that the first cap layer 128a and the second cap layer 128b are made of substantially the same material that is able to decrease effective work functions of the first and second metal gate electrodes 130a and 130b. For example, the first cap layer 128a and the second cap layer 128b may include lanthanum, yttrium, strontium or combinations thereof.

Decrease of the effective work function of the second metal gate electrode 130b, caused by the dopant in the second cap layer 128b, increases the threshold voltage of the p-type FinFET, while the germanium of the p-type channel 108 decreases the threshold voltage of the p-type FinFET. In other words, the threshold voltage of the p-type FinFET can be increased by the dopant in the second cap layer 128b, and the threshold voltage of the p-type FinFET can be decreased by the germanium of the p-type channel 108. As a result, the dopant concentration in the second cap layer 128b and the germanium concentration of the p-type channel 108 can be adjusted to tune the threshold voltage of the p-type FinFET. Decrease of the effective work function of the first metal gate electrode 130a, caused by the dopant in the first cap layer 128a, decreases the threshold voltage of the n-type FinFET. As a result, the dopant in the first cap layer 128a can be adjusted to tune the threshold voltage of the n-type FinFET. By adjusting the dopant concentration in the first and second cap layers 128a, 128b and the germanium concentration of the p-type channel 108, desired threshold voltages of the n-type and p-type FinFETs may be achieved. In some embodiments, since the desired threshold voltages of the n-type and p-type FinFETs are achieved by adjusting the dopant concentration in the first and second cap layers 128a, 128b and the germanium concentration of the p-type channel 108, the first metal gate electrode 130a and the second metal gate electrode 130b can be made of substantially the same material. For example, the first gate electrode 130a and the second gate electrode 130b can have substantially the same effective work function because the threshold voltages of the n-type and p-type FinFETs are tuned by the dopant concentration in the first and second cap layers 128a, 128b and the germanium concentration of the p-type channel 108.

The first and second metal gate electrodes 130a and 130b respectively include a first work function metal layer 132a and a second work function layer 132b. The first and second work function metal layers 132a and 132b are respectively present on the first and second gate dielectric layers 126a and 126b. More particularly, the first and second work function layers 132a and 132b are respectively present on the first and second cap layers 128a and 128b. In some embodiments, the first and second work function metal layers 132a and 132b may be made of substantial the same work function metal. In some embodiments, the first and second work function metal layers 132a and 132b may be p-work function layers. In such a configuration, the first metal gate electrode 130a covering the n-channel 106 and the second metal gate electrode 130b covering the p-channel 108 both include p-metal. In other words, the n-channel 106 and the p-channel 108 can be wrapped by the p-work function metal layers. The p-work function layer (or the p-metal) is made of a metal compound with a band edge effective work function larger than 4.9 eV, such as titanium nitride (TiN).

The first and second metal gate electrodes 130a and 130b further respectively include a first metal gate 134a and a second metal gate 134b respectively present on the first and second work function metal layers 132a and 132b. At least one of the first and second metal gates 134a and 134b may be made of, for example, W, Co, Cu. In some embodiments, the first and second metal gates 134a and 134b may be made of substantial the same metal.

Figure 13:
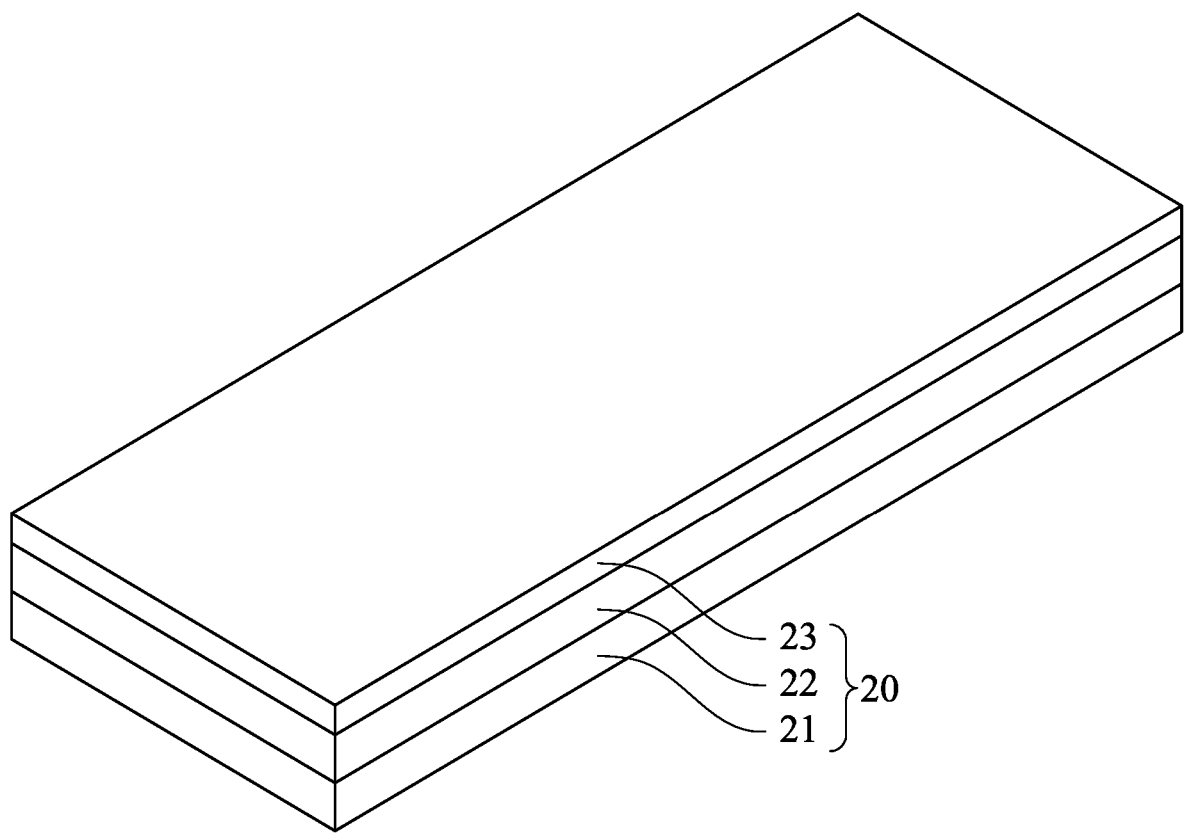
FIG. 13 to FIG. 24 illustrate different steps of a method of forming a semiconductor device according to some embodiments of the disclosure.

FIG. 13 to FIG. 24 illustrate different steps of a method of forming a semiconductor device according to some embodiments of the disclosure. As shown in FIG. 13, the method begins with a semiconductor-on-insulator (SOI) structure 20. The SOI structure 20 includes a semiconductor substrate 21, a buried oxide (BOX) layer 22 and an SOI layer 23. In some embodiments, the SOI layer 23 is formed from a semiconductor material, such as silicon. The BOX layer 22 may include silicon oxide, silicon nitride or silicon oxynitride. The BOX layer 22 is present between the semiconductor substrate 21 and the SOI layer 23. In a greater detail, the BOX layer 22 may be present underlying the SOI layer 23 and atop the semiconductor substrate 21, and the BOX layer 22 may be formed by implanting a high-energy dopant into the SOI structure 20 and then annealing the structure to form a buried oxide layer. In some other embodiments, the BOX layer 22 may be deposited or grown prior to the formation of the SOI layer 23. In yet some other embodiments, the SOI structure 20 may be formed using wafer-bonding techniques, where a bonded wafer pair is formed utilizing glue, adhesive polymer, or direct bonding.

Figure 14:
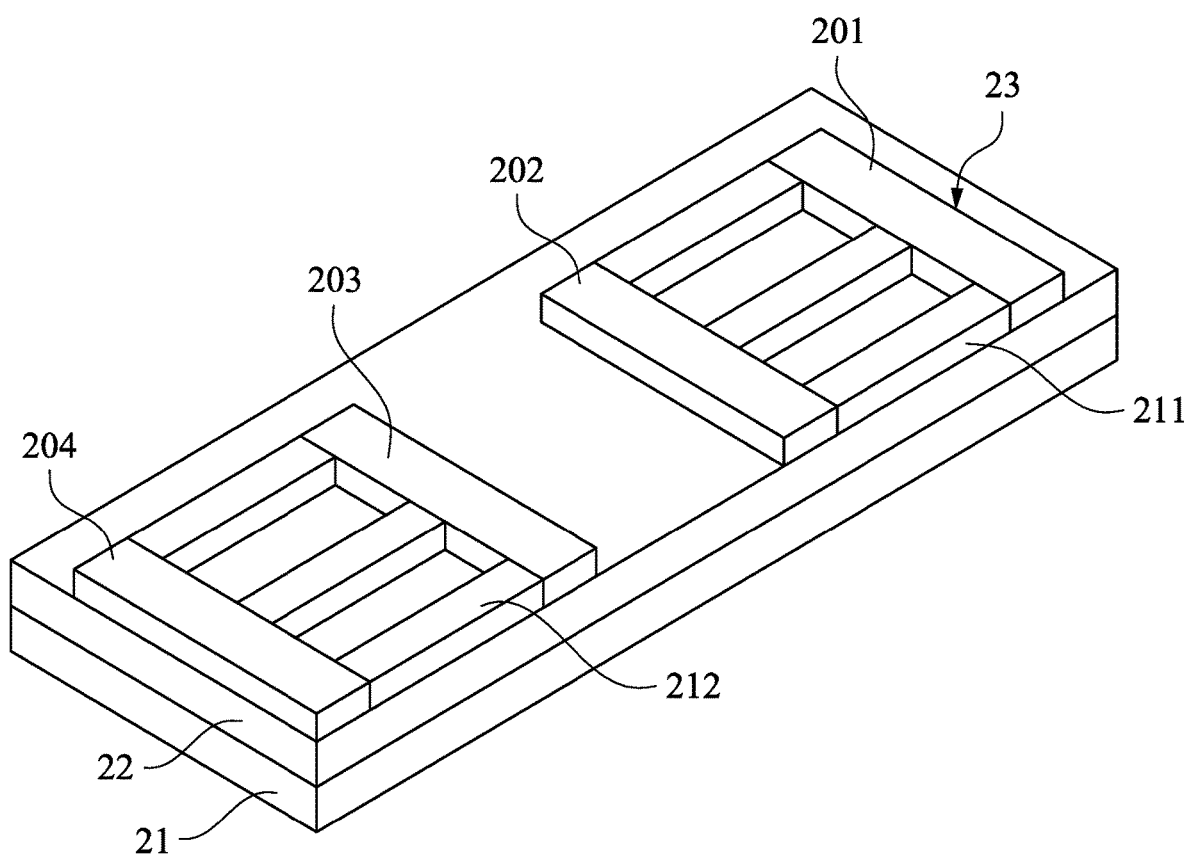

As shown in FIG. 14, the SOI layer 23 is patterned to form pads 201, 202, 203 and 204 and connecting structures 211 and 212. For example, the pads 201, 202, 203 and 204 and the connecting structures 211 and 212 may be fabricated by using suitable processes such as photolithography and etching. The connecting structures 211 connect the pads 201 and 202. The connecting structures 212 connect the pads 203 and 204. In other words, at least one of the connecting structures 211 may have separate pads 201 and 202 on opposite sides thereof, and at least one of the connecting structures 212 may have separate pads 203 and 204 on the opposite sides thereof.

Figure 15:
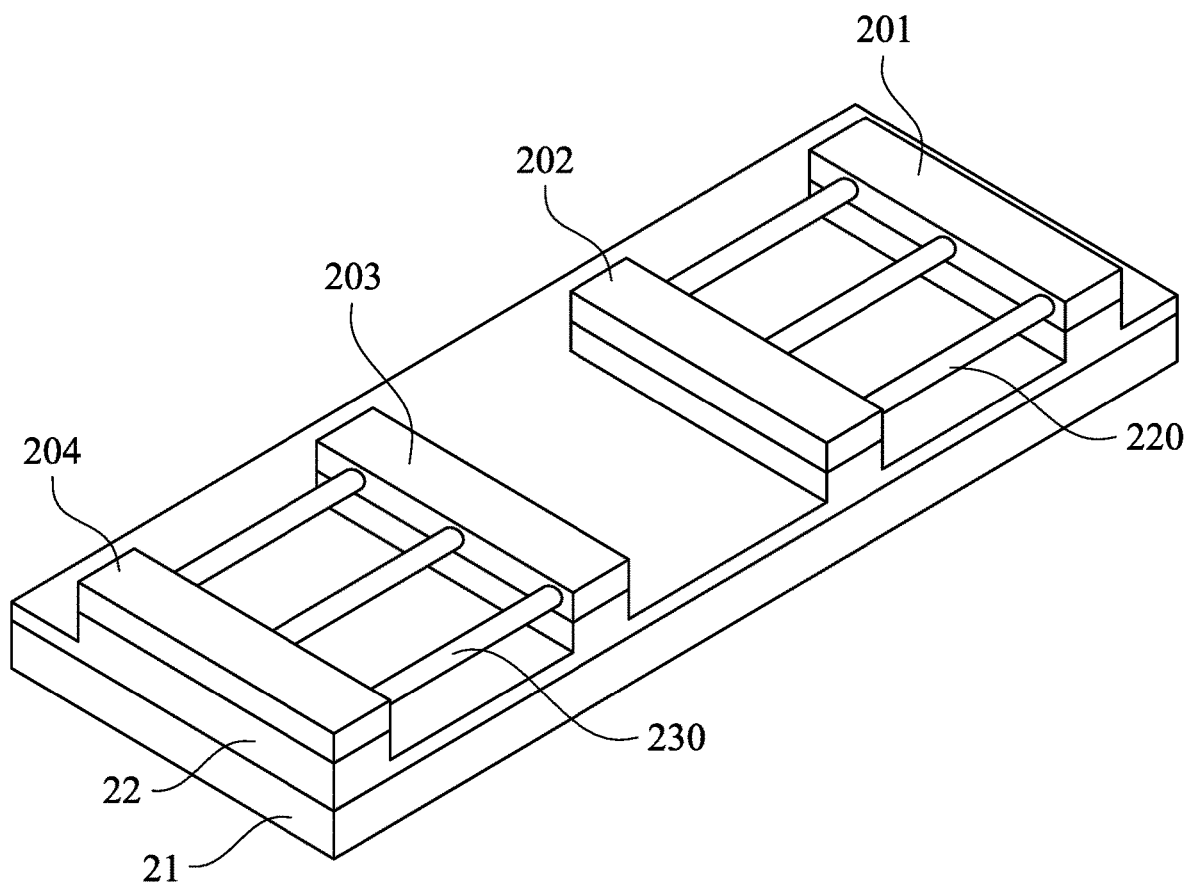

As shown in FIG. 15, the connecting structures 211 and 212 are partially removed to form first nanowires 220 and second nanowires 230. In some embodiments, lower portions of the connecting structures 211 and 212 and underlying portions of the BOX layer 22 are removed by an isotropic etching process, so that the first nanowires 220 are formed as suspended between the pads 201 and 202, and the second nanowires 230 are formed as suspended between the pads 203 and 204. The isotropic etching is a form of etching that does not include a preferential direction. One example of an isotropic etching is wet etching. The isotropic etching process forms undercut regions that the first and second nanowires 220 and 230 are suspended over. In some embodiments, the isotropic etching may be performed using a diluted hydrofluoric acid (DHF). After the isotropic etching process, the first and second nanowires 220 and 230 may be smoothed to form elliptical shaped (and in some cases, cylindrical shaped) structures. In some embodiments, the smoothing process may be performed by an annealing process. Example annealing temperature may range from about 600° C. to about 1000° C., and the hydrogen pressure in the annealing process may range from about 7 ton to about 600 torr.

Figure 16:
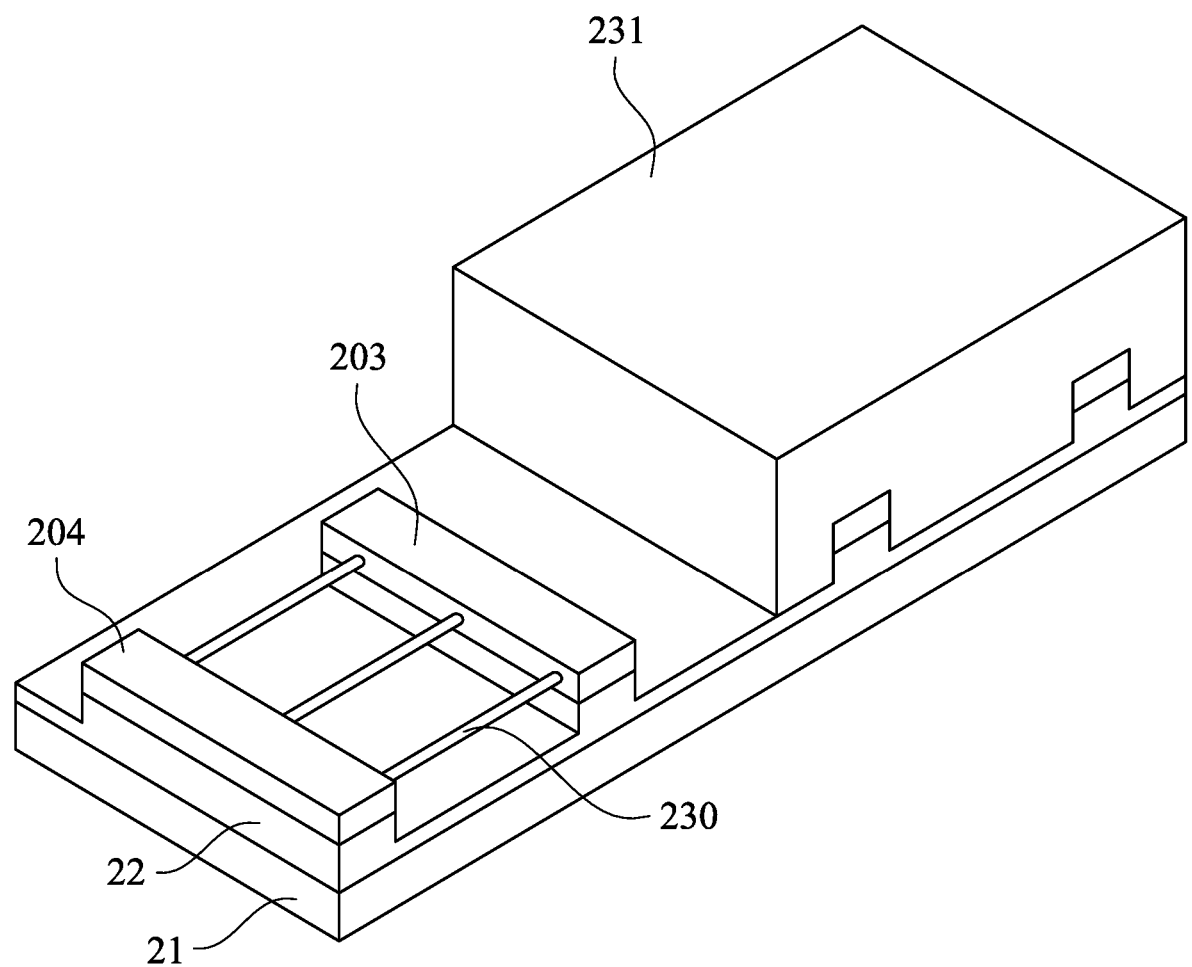

As shown in FIG. 16, the second nanowires 230 may be further thinned. As described in conjunction with the description of FIG. 15, the second nanowires 230 may be re-shaped (e.g., smoothed) to an elliptical (e.g., circular) cross-sectional shape earlier in the process. Now, the second nanowires 230 may be further thinned. For example, the second nanowires 230 may be further thinned at this step using a high-temperature (e.g., from about 700° C. to about 1,000° C.) oxidation of the second nanowires 230 followed by etching of the grown oxide. The oxidation and etching process may be repeated multiple times to achieve desired second nanowires 230 dimensions. During the thinning process, the first nanowires 220 and the pads 201 and 202 can be protected by a mask 231. The mask 231 may be a hard mask including, for example, silicon nitride ($Si_3N_4$).

Figure 17:
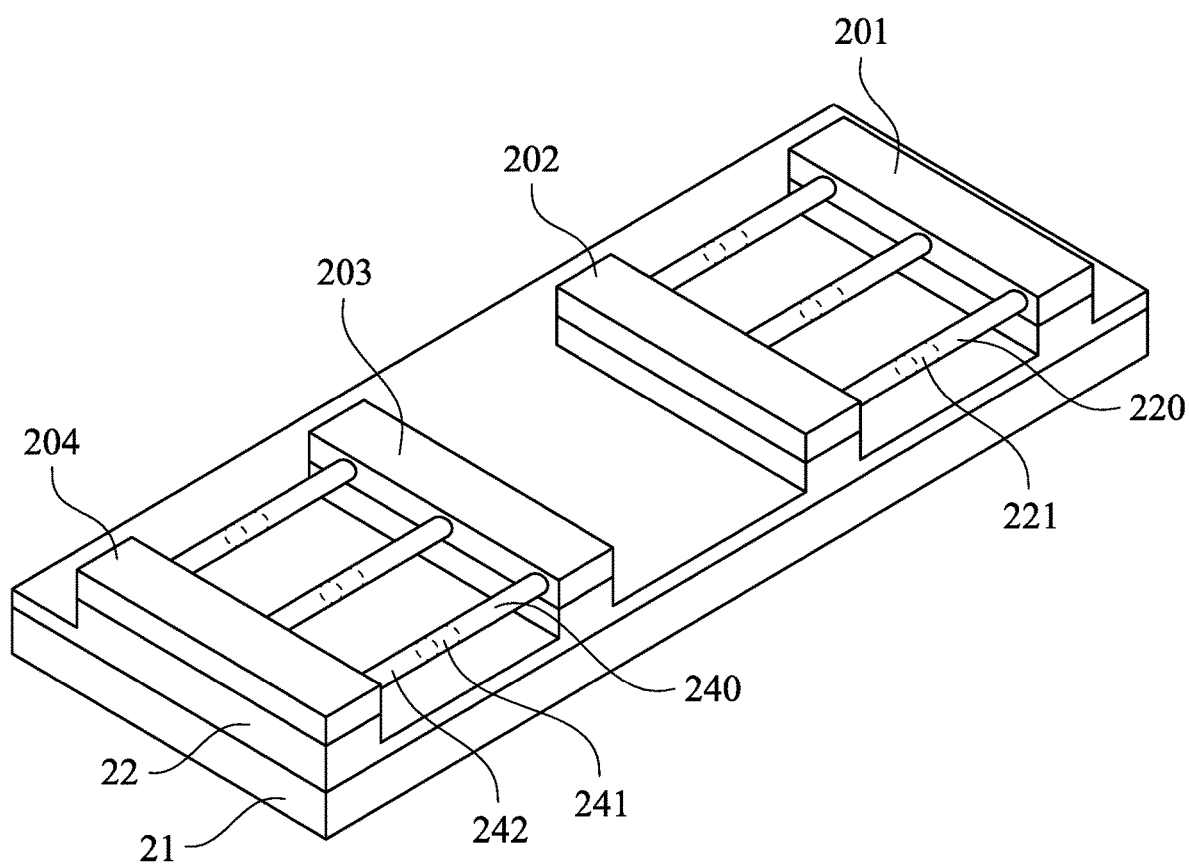

As shown in FIG. 17, epitaxial sheathes 242 are then formed around the second nanowires 230 to form sheathed nanowires 240. The epitaxial sheath 242 has a material different from the first nanowires 220. For example, the first nanowires 220 may be made of silicon, while the epitaxial sheath 242 may be made of silicon germanium, which may be epi-grown by an LPCVD process. The LPCVD process may be performed at a temperature in a range from about 400° C. to 800° C. and under a pressure in a range from about 1 to 200 Torr, using silicon-containing gases, such as $SiH_4$, and germanium-containing gases, such as $GeH_4$, as reaction gases. After formation of the sheathed nanowires 240, the mask 231 can be removed. An exemplary method of removing the mask 231 is wet etching which is able to selectively remove silicon nitride, and this wet etching utilizes hot (approximately 145° C.-180° C.) phosphoric acid ($H_3PO_4$) solutions with water.

Portions of the first nanowires 220 may serve as n-channels 221 for an n-type nanowire FET. Portions of the epitaxial sheath 242 of the sheathed nanowires 240 may serve as p-channels 241 for a p-type nanowire FET. Since the first nanowires 220 and the epitaxial sheath 242 are made of different materials, the n-channels 221 and the p-channels 241 are made of different materials. In particular, the n-channels 221 may be made of silicon, while the p-channels 241 may be made of silicon germanium. Because germanium shifts the valence band of the p-channels 241, the germanium concentration (or the germanium atomic percentage) of the p-channels 241 may be controlled to tune the threshold voltage of the p-type nanowire FET. Control of the germanium concentration may be implemented by the ratio of the flow rate of the germanium-containing gases to the flow rate of the silicon-containing gases during epitaxy growth of the epitaxial sheath 242.

In some embodiments, the first nanowires 220 may be further thinned, and then, III-V compound semiconductor sheathes may be formed on the first nanowires 220 through epitaxial growth, so that portions of the III-V compound semiconductor sheathes serve as the n-channels. The III-V compound semiconductor material may be, but is not limited to, InAs, AlAs, GaAs, InP, GaN, InGaAs, InAlAs, GaSb, AlSb, AlP, GaP, or the like.

Figure 18:
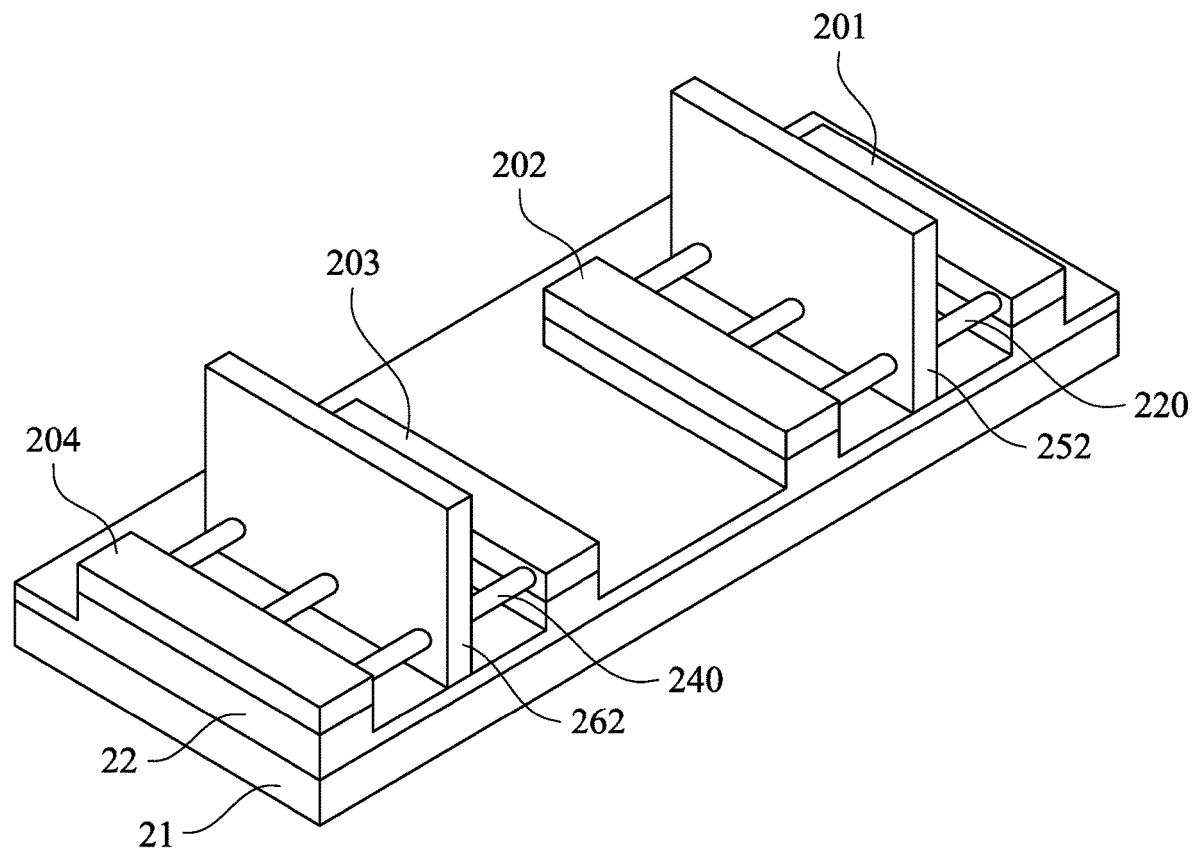

As shown in FIG. 18, dummy gate material layers 252 and 262 are formed on the BOX layer 22 and respectively cover the first nanowires 220 and the sheathed nanowires 240. The dummy gate material layers 252 and 262 may include poly silicon. The dummy gate material layers 252 and 262 can be formed by a deposition process, such as a CVD process. The dummy gate material layers 252 and 262 are patterned to form structures respectively crossing and covering portions of the first nanowires 220 and the sheather nanowires 240. The patterning step includes performing photolithography and etching processes.

Figure 19:
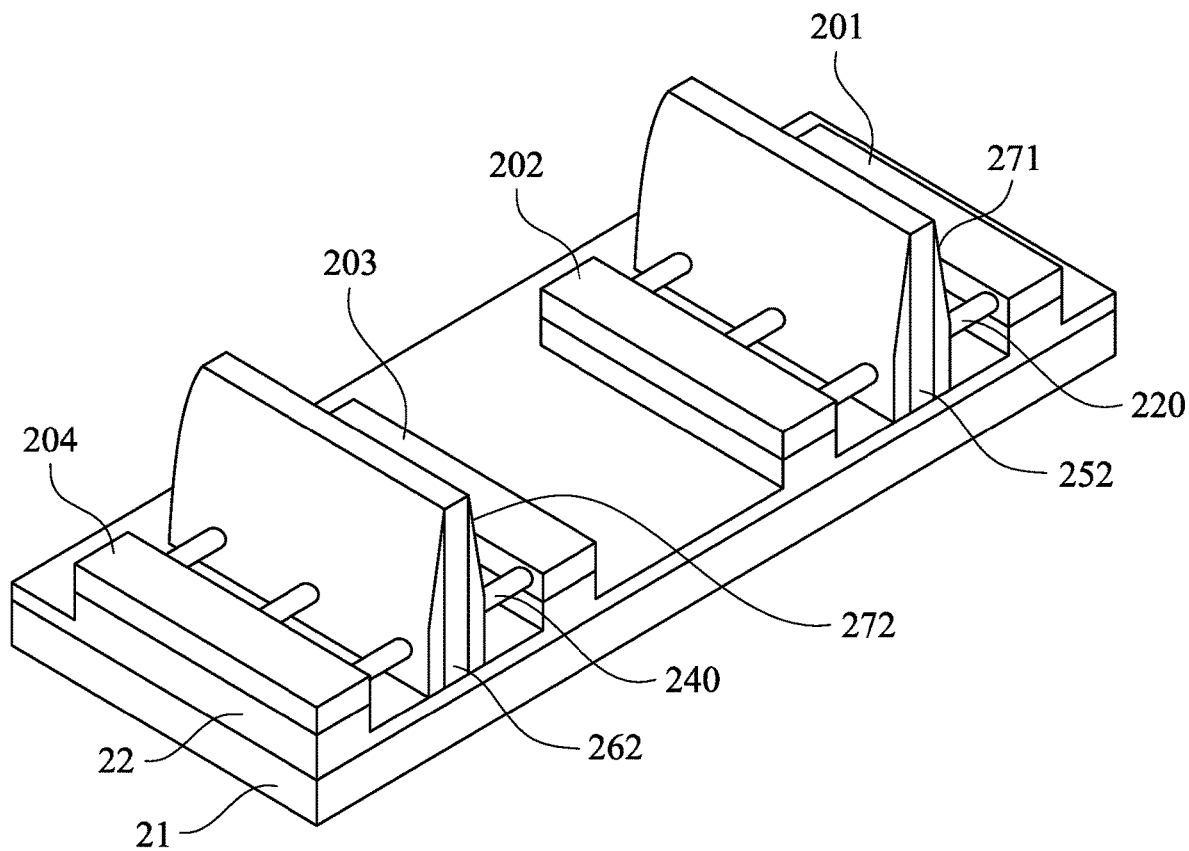

As shown in FIG. 19, spacers 271 are formed on opposite sidewalls of the dummy gate material layer 252, and spacers 272 are formed on opposite sidewalls of the dummy gate material layer 262. The method of forming the spacers 271 and 272 includes forming a dielectric layer and then performing an etching process to remove a portion of the dielectric layer.

Following the formation of the spacers 271 and 272, an n-type dopant may be introduced to the exposed portions of the first nanowires 220 that are adjacent to the spacers 271, so as to form n-type source/drain extension regions. Similarly, a p-type dopant may be introduced to the exposed portions of the sheathed nanowires 240 that are adjacent to the spacers 272, so as to form p-type source/drain extension regions. An Example of the p-type dopant includes, but is not limited to, boron, aluminum, gallium and indium. An example of the n-type dopant includes, but is not limited to, antimony, arsenic and phosphorous.

In some embodiments, source/drain extension regions are formed in the first nanowires 220 and the sheathed nanowires 240 using an in-situ doped epitaxial growth process followed by an annealing process to drive the dopant from the in-situ doped epitaxial semiconductor material into the first nanowires 220 and the sheathed nanowires 240 to provide the extension regions. In some embodiments, the in-situ doped semiconductor material is formed using an epitaxial growth process. "In-situ doped" means that the dopant is incorporated into the in-situ doped semiconductor material during the epitaxial growth process that deposits the semiconductor containing material of the in-situ doped semiconductor material. When the chemical reactants are controlled, the depositing atoms arrive at the surface of the first and sheathed nanowires 220 and 240 and the pads 201, 202, 203 and 204 with sufficient energy to move around on the surface and orient themselves to the crystal arrangement of the atoms of the deposition surface. The epitaxial growth thickens the pads 201, 202, 203 and 204 and portions of the first nanowires 220 and the sheathed nanowires 240 that are not covered by the dummy gate material layers 252 and 262, and the spacers 271 and 272.

Thereafter, ion implantation may be performed to the pads 201, 202, 203 and 204 to form deep source/drain regions. The deep source/drain regions may be formed using ion implantation. During the ion implant that provides the deep source/drain regions, the portions of the device in which the implant is not desirable may be protected by a mask, such as a photoresist mask. The deep source/drain regions in the pads 201 and 202 have the same conductivity dopant as the source/drain extension regions in the first nanowires 220, such as the n-type dopant, but the deep source/drain regions in the pads 201 and 202 have a greater dopant concentration then the source/drain extension regions in the first nanowires 220. Similarly, the deep source/drain regions in the pads 203 and 204 have the same conductivity dopant as the source/drain extension regions in the sheathed nanowires 240, such as the p-type dopant, but the deep source/drain regions in the pads 203 and 204 have a greater dopant concentration then the source/drain extension regions in the sheathed nanowires 240.

Figure 20:
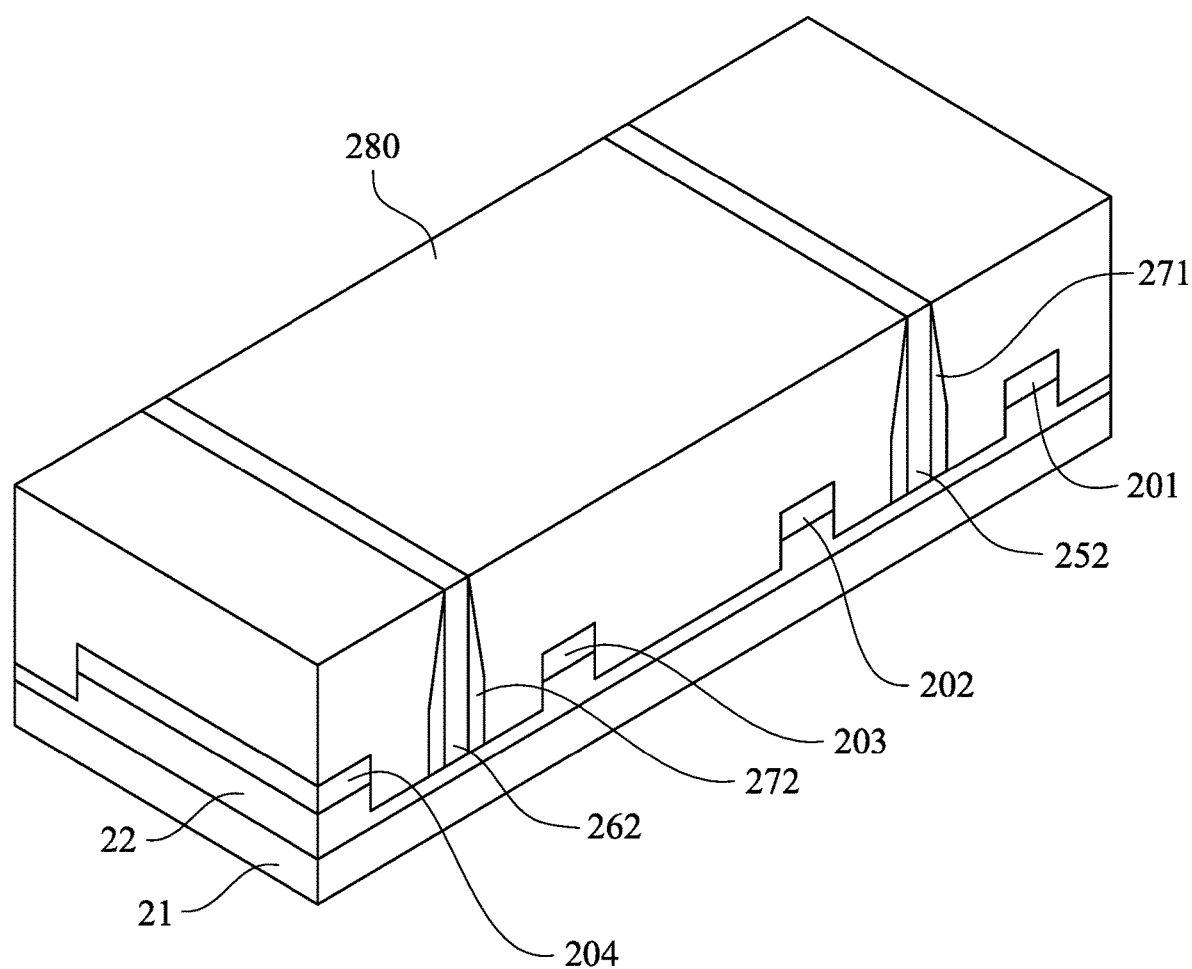

As shown in FIG. 20, an interlayer dielectric (ILD) layer 280 is formed to cover the dummy gate material layers 252 and 262, the first nanowires 220 and the sheathed nanowires 240. The ILD layer 280 may include silicon oxide, silicon nitride, silicon oxynitride, silicon carbide, a low-dielectric constant dielectric material, or combinations thereof. The ILD layer 280 can be formed by a deposition process, such as a CVD process. Afterwards, a portion of the ILD layer 280 is removed to expose top surfaces of the dummy gate material layers 252 and 262. The removing step may include performing a chemical-mechanical polishing (CMP) process.

Figure 21:
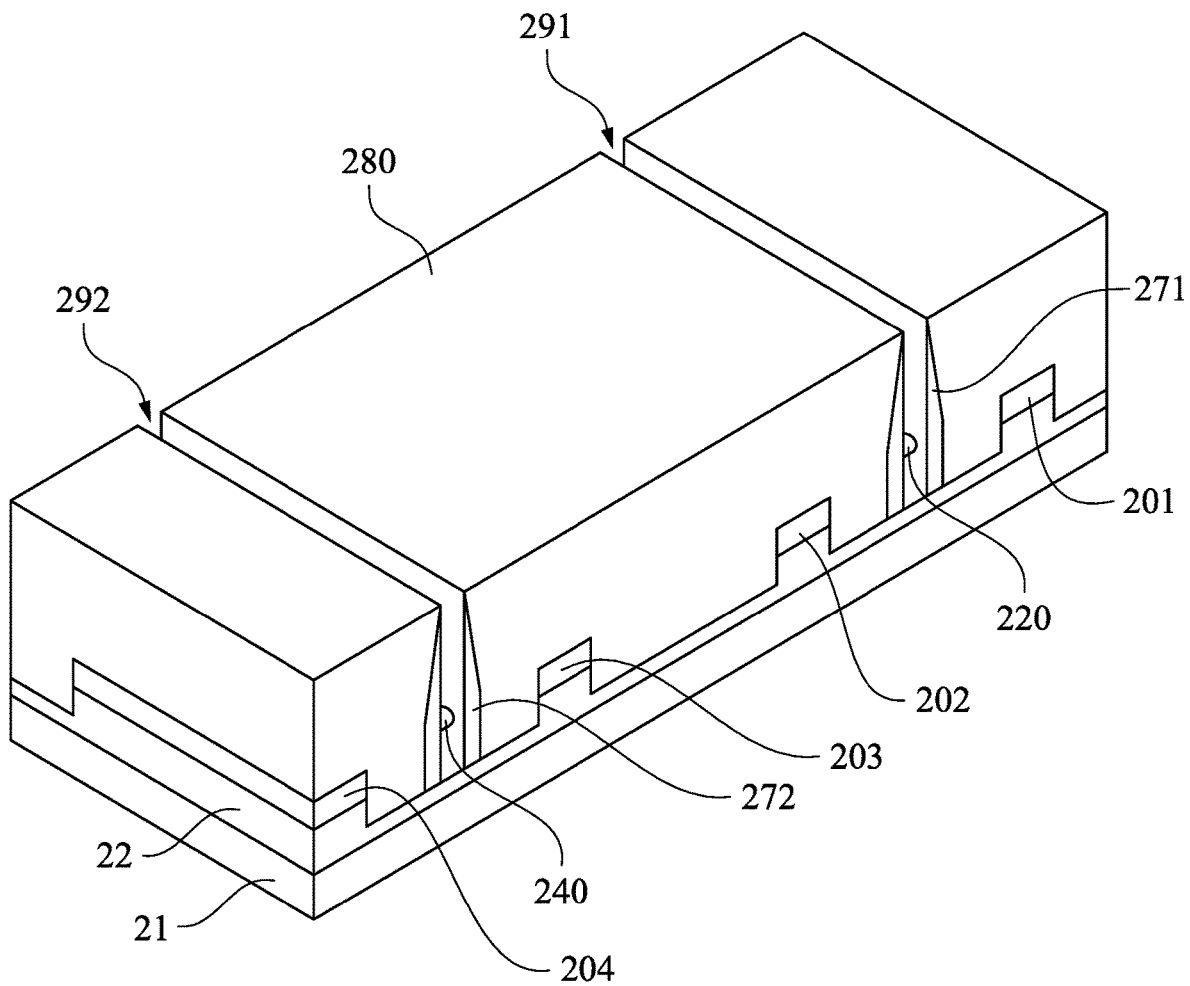

As shown in FIG. 21, the dummy gate material layers 252 and 262 are removed by using suitable processes, such as wet etching. After removal of the dummy gate material layers 252 and 262, a first recess 291 is formed between the spacers 271, and a second recess 292 is formed between the spacers 272, and the first and second recesses 291 and 292 are spatially isolated from each other by the spacers 271, 272 and the ILD layer 280.

Figure 22:
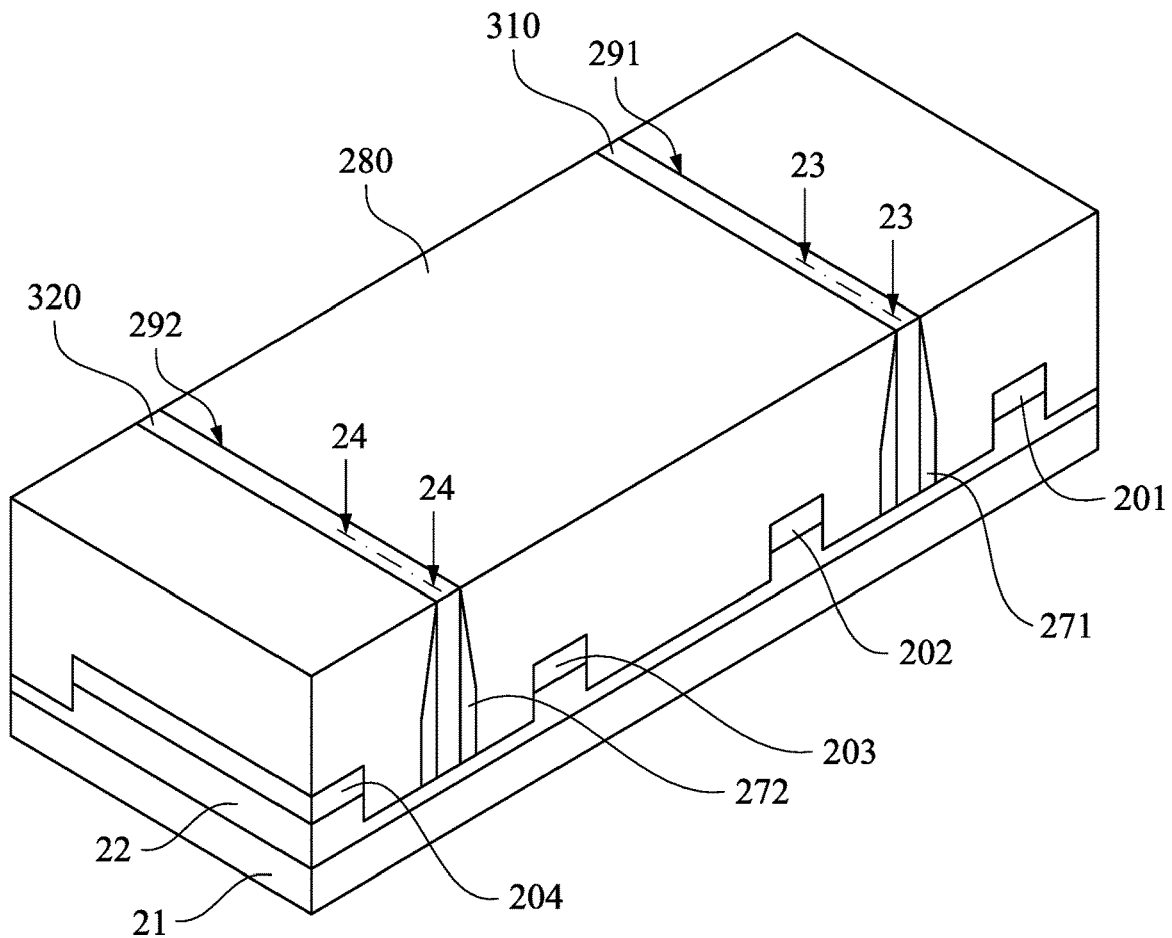
Figure 23:
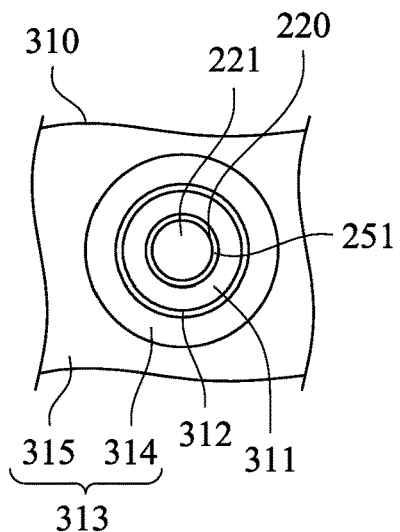
Figure 24:
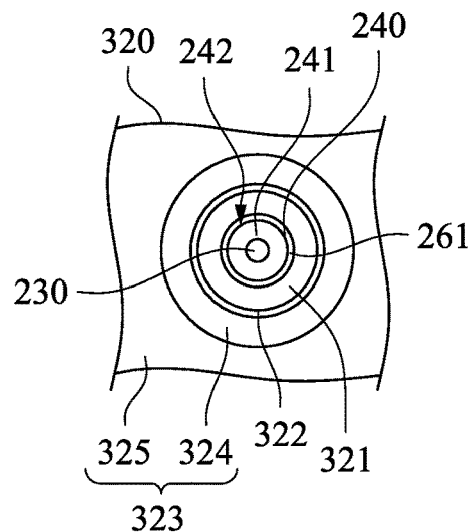

Reference is made to FIG. 22 to FIG. 24, in which FIG. 23 and FIG. 24 are respectively cross-sectional views taken along lines 23 and 24 in FIG. 22. Interfacial layers 251 and 261 are respectively conformally formed on the first nanowires 220 and the sheathed nanowires 240 by using, for example, a thermal process. The interfacial layers 251 and 261 may include silicon oxide. A first gate structure 310 and a second gate structure 320 are formed in the first and second recesses 291 and 292 to respectively cross and surround the first nanowires 220 and the sheathed nanowires 240. Referring to FIGS. 23 and 24, formation of the first and second gate structures 310 and 320 includes forming a first gate dielectric layer 311 and a second gate dielectric layer 321 respectively on the n-channels 221 of the first nanowires 220 and the p-channel 241 of the sheathed nanowires 240. The first gate dielectric layer 311 and the second gate dielectric layer 321 may be formed in the same process. For example, formation of the first gate dielectric layer 311 and the second gate dielectric layer 321 includes forming a gate dielectric layer on the ILD layer 280, the first nanowires 220 and the sheathed nanowires 240 by, for example, a deposition process, and then removing a portion of the gate dielectric layer outside the first and second recesses 291 and 292, so that the remaining portions in the first and second recesses 291 and 292 respectively serve as the first and second gate dielectric layer 311 and 321. The first gate dielectric layer 311 and the second gate dielectric layer 321 respectively wrap the first nanowires 220 and sheathed nanowires 240. The first gate dielectric layer 311 is present on at least opposite sidewalls of the n-channel 221, and the second gate dielectric layer 321 is present on at least opposite sidewalls of the p-channel 241. In some embodiments, the n-channel 221 and p-channel 241 are non-planar and are cylindrical, and the first and second gate dielectric layers 311 and 321 respectively surround the cylindrical n-channel 221 and p-channel 241. At least one of the first and second gate dielectric layers 311 and 321 includes a high-k material with high dielectric constant. The high-k material may be hafnium oxide ($HfO_2$), hafnium silicon oxide ($HfSiO_4$), hafnium silicon oxynitride (Hf-SiON) or other suitable material. In some embodiments, the first gate dielectric layer 311 and the second gate dielectric layer 321 are made of substantially the same high-k dielectric material, which benefits manufacturing the first gate dielectric layer 311 and the second gate dielectric layer 321. For example, the first gate dielectric layer 311 and the second gate dielectric layer 321 may be made of hafnium oxide ($HfO_2$).

Thereafter, a first cap layer 312 and a second cap layer 322 are formed to cap and surround the first and second gate dielectric layers 311 and 321 respectively. The first and second cap layers 312 and 322 may be formed in the same process. For example, formation of the first and second cap layers 312 and 322 includes forming a gate dielectric layer on the ILD layer 280, the first nanowires 220 and the sheathed nanowires 240, doping a dopant to the gate dielectric layer to form an oxide layer thereon, which serves as the cap layer, and then removing portions of the gate dielectric layer and the cap layer outside the first and second recesses 291 and 292, so that the remaining portions of the cap layer in the first and second recesses 291 and 292 respectively serve as the first and second cap layers 312 and 322.

Thereafter, a first metal gate electrode 313 and a second metal gate electrode 323 are formed, and respectively present on the first and second cap layers 312 and 322. More particularly, the first cap layer 312 is present between the first gate dielectric layer 311 and the first metal gate electrode 313, and the second cap layer 322 is present between the second gate dielectric layer 321 and the second metal gate electrode 323. The first and second cap layers 312 and 322 are respectively in contact with the first and second metal gate electrodes 313 and 323.

In some embodiments, the first cap layer 312 is made of a material that is able to decrease an effective work function of the first metal gate electrode 313, so that the threshold voltage of the n-type nanowire FET may be tuned by the first cap layer 312. In particular, the first cap layer 312 may include a rare earth compound, strontium or combinations thereof. The rare earth compound may be, for example, lanthanum(La), yttrium (Y), dysprosium (Dy), ytterbium (Yb), lutetium (Lu), scandium (Sc), cerium (Ce), praseodymium (Pr), neodymium (Nd), europium (Eu), gadolinium (Gd), terbium (Tb), or erbium (Er). For example, the first cap layer 312 may be made of lanthanum oxide, yttrium oxide, strontium oxide or combinations thereof. Formation of the first cap layer 312 includes doping a dopant including a material, such as lanthanum, yttrium, strontium or combinations thereof, to the first gate dielectric layer 311, thereby forming a layer of lanthanum oxide, yttrium oxide, strontium oxide or combinations thereof on the first gate dielectric layer 311 to serve as the first cap layer 312. The dopant dose of lanthanum, yttrium, strontium or combinations thereof may affect the effective work function of the first metal gate electrode 313, and therefore, the threshold voltage of the n-type nanowire FET may be tuned by the dopant dose of lanthanum, yttrium, strontium or combinations thereof.

In some embodiments, the second cap layer 322 is made of a material that is able to decrease an effective work function of the second metal gate electrode 323 formed thereon, so that the threshold voltage of the p-type nanowire FET may be tuned by the second cap layer 322. In particular, the second cap layer 322 may include a rare earth compound, strontium or combinations thereof. The rare earth compound may be, for example, lanthanum(La), yttrium (Y), dysprosium (Dy), ytterbium (Yb), lutetium (Lu), scandium (Sc), cerium (Ce), praseodymium (Pr), neodymium (Nd), europium (Eu), gadolinium (Gd), terbium (Tb), or erbium (Er). For example, the second cap layer 322 may be made of lanthanum oxide, yttrium oxide, strontium oxide or combinations thereof. Formation of the second cap layer 322 includes doping a dopant including a material, such as lanthanum, yttrium, strontium or combinations thereof, to the second gate dielectric layer 321, thereby forming a layer of lanthanum oxide, yttrium oxide, strontium oxide or combinations thereof on the second gate dielectric layer 321 to serve as the second cap layer 322. The dopant dose of lanthanum, yttrium, strontium or combinations thereof may affect the effective work function of the second metal gate electrode 323, and therefore, the threshold voltage of the p-type nanowire FET may be tuned by the dopant dose of lanthanum, yttrium, strontium or combinations thereof. In some embodiments, the first gate dielectric layer 311 and the second gate dielectric layer 321 are doped with substantially the same dopant, so that the first cap layer 312 and the second cap layer 322 are made of substantially the same material that is able to decrease effective work functions of the first and second metal gate electrodes 313 and 323, which benefits manufacturing the first cap layer 312 and the second cap layer 322. For example, the first cap layer 312 and the second cap layer 322 may include lanthanum, yttrium, strontium or combinations thereof.

Decrease of the effective work function of the second metal gate electrode 323, caused by the dopant in the second cap layer 322, increases the threshold voltage of the p-type nanowire FET, while the germanium of the p-type channel 241 decreases the threshold voltage of the p-type nanowire FET. In other words, the threshold voltage of the p-type nanowire FET can be increased by the dopant in the second cap layer 322, and it can be decreased by the germanium of the p-type channel 241. As a result, the dopant concentration in the second cap layer 322, and the germanium concentration of the p-type channel 241 can be adjusted to tune the threshold voltage of the p-type nanowire FET. Decrease of the effective work function of the first metal gate electrode 313, caused by the dopant in the first cap layer 312, decreases the threshold voltage of the n-type nanowire FET. As a result, the dopant in the first cap layer 312 can be adjusted to tune the threshold voltage of the n-type nanowire FET. By adjusting the dopant concentration in the first and second cap layers 312, 322 and the germanium concentration of the p-type channel 241, desired threshold voltages of the n-type and p-type nanowire FETs may be achieved. In some embodiments, since the desired threshold voltages of the n-type and p-type nanowire FETs are achieved by adjusting the dopant concentration in the first and second cap layers 312, 322 and the germanium concentration of the p-type channel 241, the first metal gate electrode 313 and the second metal gate electrode 323 can be made of substantially the same material, which benefits manufacturing the first metal gate electrode 313 and the second metal gate electrode 323. For example, the first gate electrode 313 and the second gate electrode 323 can have substantially the same effective work function because the threshold voltages of the n-type and p-type nanowire FETs are tuned by the dopant concentration in the first and second cap layers 312, 322 and the germanium concentration of the p-type channel 241.

Referring to FIG. 23 and FIG. 24, formation of the first and second metal gate electrodes 313 and 323 includes forming a first work function metal layer 314 and a second work function metal layer 324. The first and second work function metal layers 314 and 324 are respectively present on the first and second gate dielectric layers 311 and 321. More particularly, the first and second work function layers 314 and 324 respectively surround or wrap the first and second cap layers 312 and 322. In some embodiments, the first and second work function metal layers 314 and 325 may be made of substantial the same work function metal and formed in the same process, and an exemplary formation method includes forming a work function metal layer on the ILD layer 280 and in the first and second recesses 291 and 292 by a deposition process, such as an ALD process, a CVD process, a PVD process or a sputter deposition process, and then removing an excess portion of the work function metal layer outside the first and second recesses 291 and 292 to form the first and second work function metal layers 314 and 324 isolated from each other. In some embodiments, the first and second work function metal layers 314 may be p-work function layers, which may benefit achieving the same effective work function of the first metal gate electrode 313 of the n-type nanowire FET and the second metal gate electrode 323 of the p-type nanowire FET. In such a configuration, the first metal gate electrode 313 covering the n-channel 221 and the second metal gate 323 covering the p-channel 241 include p-metal. In other words, the n-channel 221 and the p-channel 241 can be surrounded by the p-work function metal layers. In some embodiments, at least one of the first and second work function metal layers 314 and 324 can be made of, for example, titanium nitride (TiN).

Thereafter, a first and second metal gates 315 and 325 are formed, and respectively surround the first and second work function metal layers 314 and 324. In some embodiments, the first and second metal gates 315 and 325 may be made of substantial the same metal and formed in the same process, and an exemplary formation method includes forming a metal gate on the ILD layer 280 and in the first and second recesses 291 and 292 by a deposition process, such as an ALD process, a CVD process, a PVD process or a sputter deposition process, and then removing an excess portion of the metal gate outside the first and second recesses 291 and 292 to form the first and second metal gates 315 and 325 isolated from each other. In some embodiments, at least one of the first and second metal gates 315 and 325 may be made of, for example, W, Co, Cu.

Figure 25:
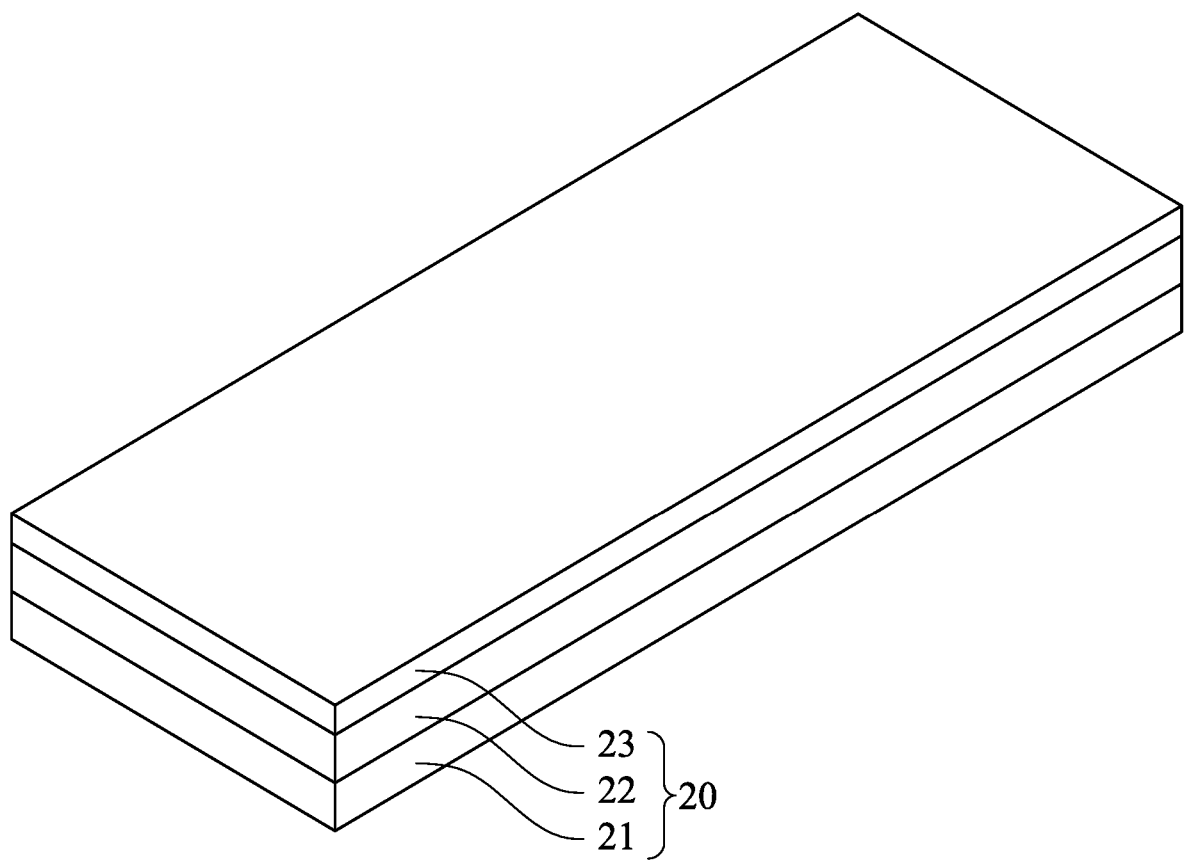
FIG. 25 to FIG. 31 illustrate different steps of a method of forming a semiconductor device according to some embodiments of the disclosure.

FIG. 25 to FIG. 31 illustrate different steps of a method of forming a semiconductor device according to some embodiments of the disclosure. As shown in FIG. 25, the method begins with a semiconductor-on-insulator (SOI) structure 20. Similar to FIG. 13, the SOI structure 20 includes a semiconductor substrate 21, a buried oxide (BOX) layer 22 and an SOI layer 23. In some embodiments, the SOI layer 23 is formed from a semiconducting material, such as silicon. The BOX layer 22 may include silicon oxide, silicon nitride or silicon oxynitride. The BOX layer 22 is present between the semiconductor substrate 21 and the SOI layer 23. Formation of the SOI structure 20 is similar to which is described in the context relating to FIG. 13, and it is thus not described repeatedly.

Figure 26:
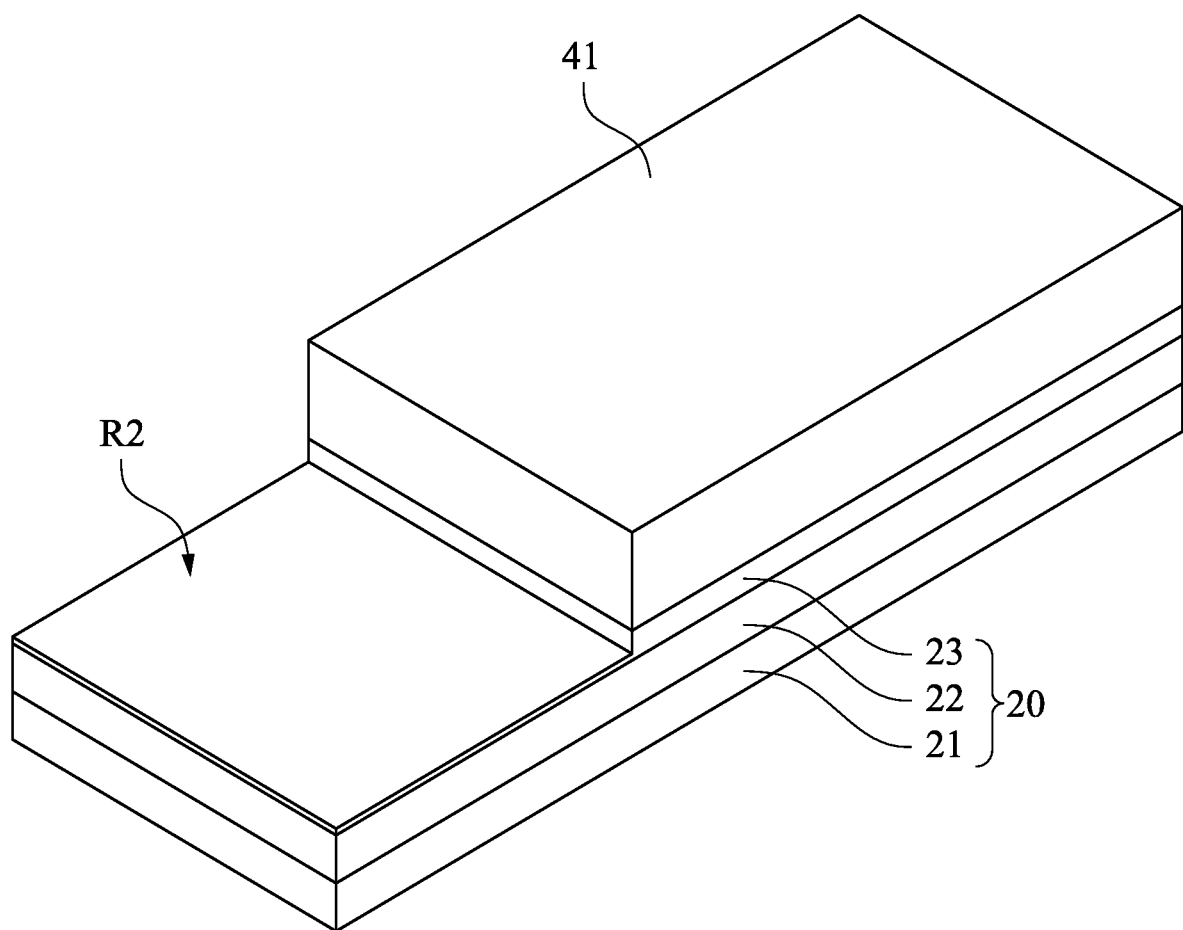

As shown in FIG. 26, a portion of the SOI layer 23 is removed to form a recess R2. During removal of the portion of the SOI layer 23, other portion of the SOI layer 23 may be protected by a mask 41, such as a photoresist mask. The removal of the portion of the SOI layer 23 may be performed by reactive ion etching (RIE) or by any other suitable removal process. In some embodiments, the removal of the portion of the SOI layer 23 may be performed under a pressure in a range from about 1 mTorr to about 1000 mTorr, a power in a range from about 50 W to about 1000 W, a bias voltage in a range from about 20 V to about 500 V, at a temperature in a range from about 40° C. to about 60° C., and/or using HBr and/or $Cl_2$ as etching gases.

Figure 27:
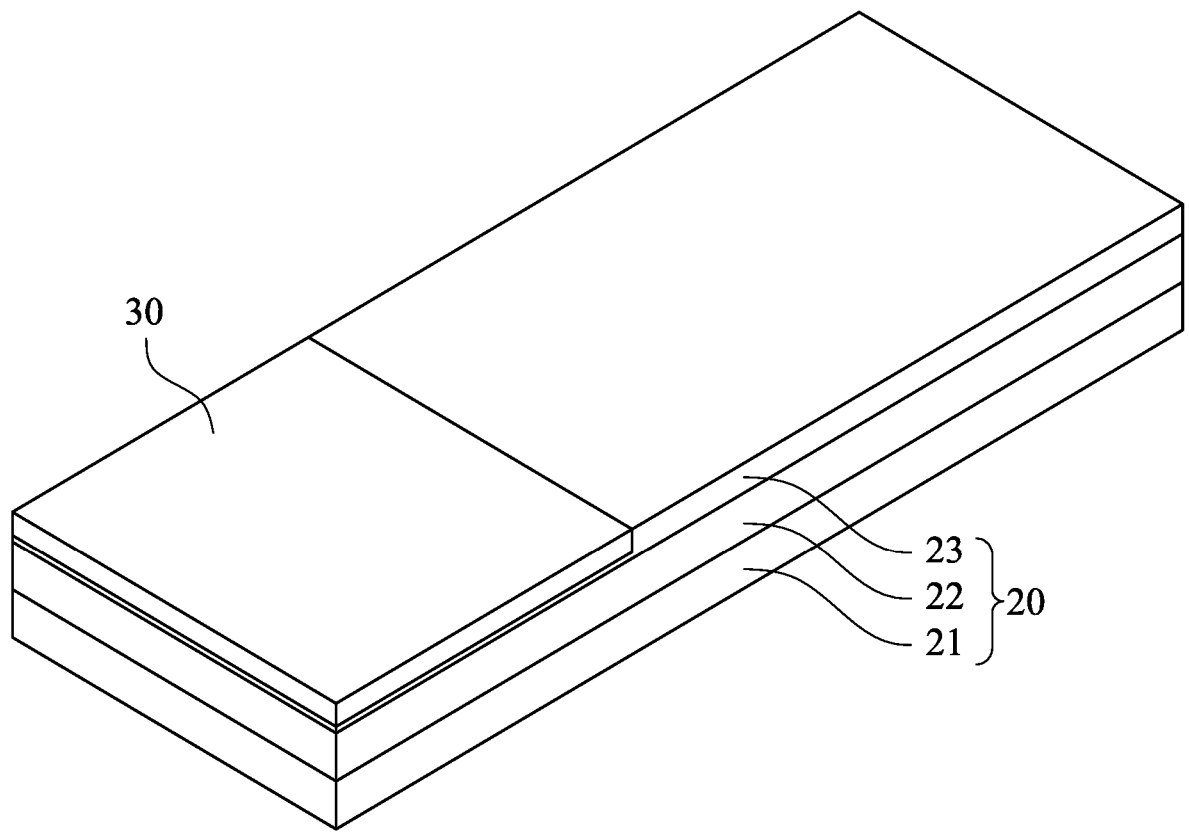

As shown in FIG. 27, an epitaxial structure 30 having a material different from the SOI layer 23 may be formed in the recess R2. For example, the SOI layer 23 may be made of silicon, while the epitaxial structure 30 may be made of silicon germanium. In some embodiments, the epitaxial structure 30 may be epi-grown by a low-pressure chemical vapor deposition (LPCVD) process. The LPCVD process may be performed at a temperature in a range from about 400° C. to about 800° C., under a pressure in a range from about 1 to about 200 Torr, and using at least one silicon-containing gas, such as $SiH_4$, and at least one germanium-containing gas, such as $GeH_4$, as reaction gases. Control of the germanium concentration may be implemented by the ratio of the flow rate of the germanium-containing gas to the flow rate of the silicon-containing gas during epitaxy growth of the epitaxial structure 30. After the formation of the epitaxial structure 30, the mask 41 can be removed by ashing, stripping, or other suitable techniques.

Figure 28:
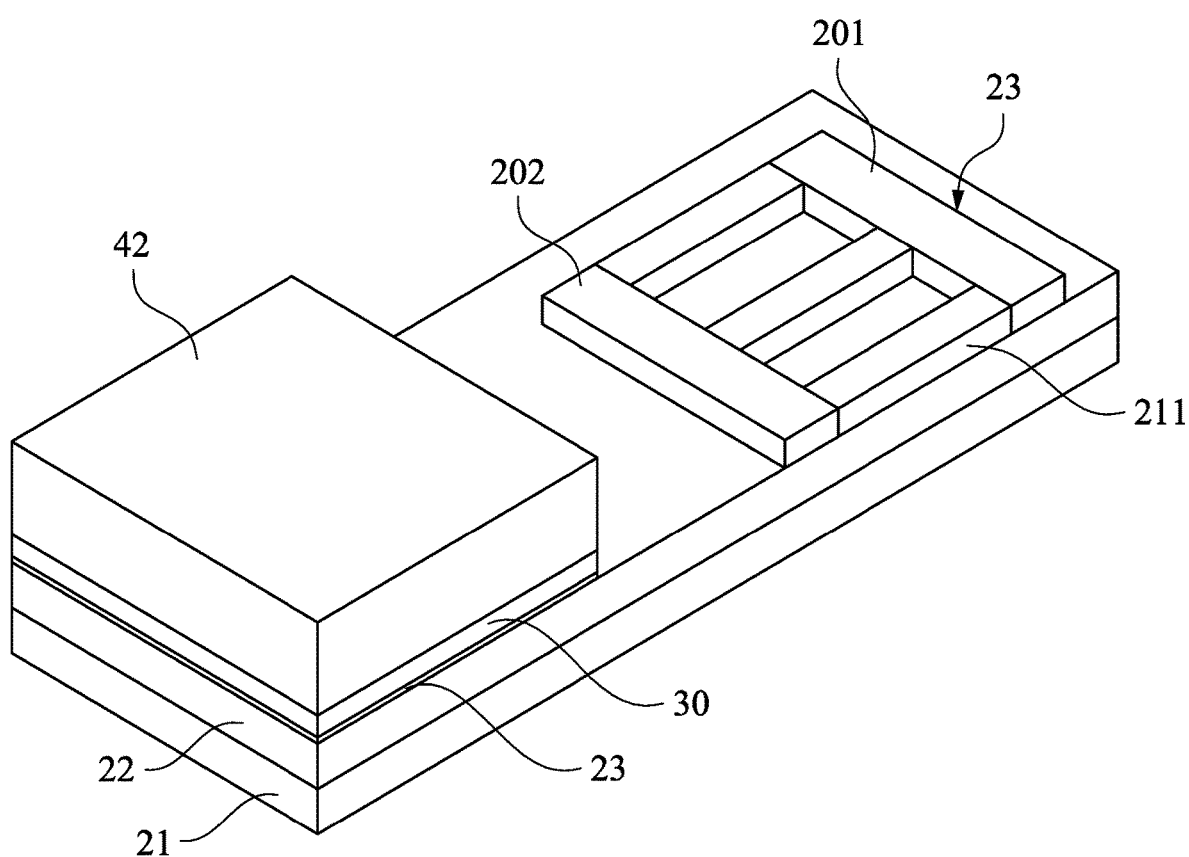

As shown in FIG. 28, the epitaxial structure 30 is covered by a mask 42, while a portion of the SOI layer 23 is exposed by the mask 42. The exposed portion of the SOI layer 23 is patterned to form pads 201 and 202 and connecting structures 211. For example, the pads 201 and 202, and the connecting structures 211 and 212 may be fabricated by using suitable processes such as photolithography and etch. The connecting structures 211 connect the pads 201 and 202. In other words, each connecting structure 211 may have separate pads 201 and 202 on opposite sides thereof. The mask 42 may be a hard mask, such as silicon nitride ($Si_3N_4$), which has relatively high etching resistivity compared to the SOI layer 23.

Figure 29:
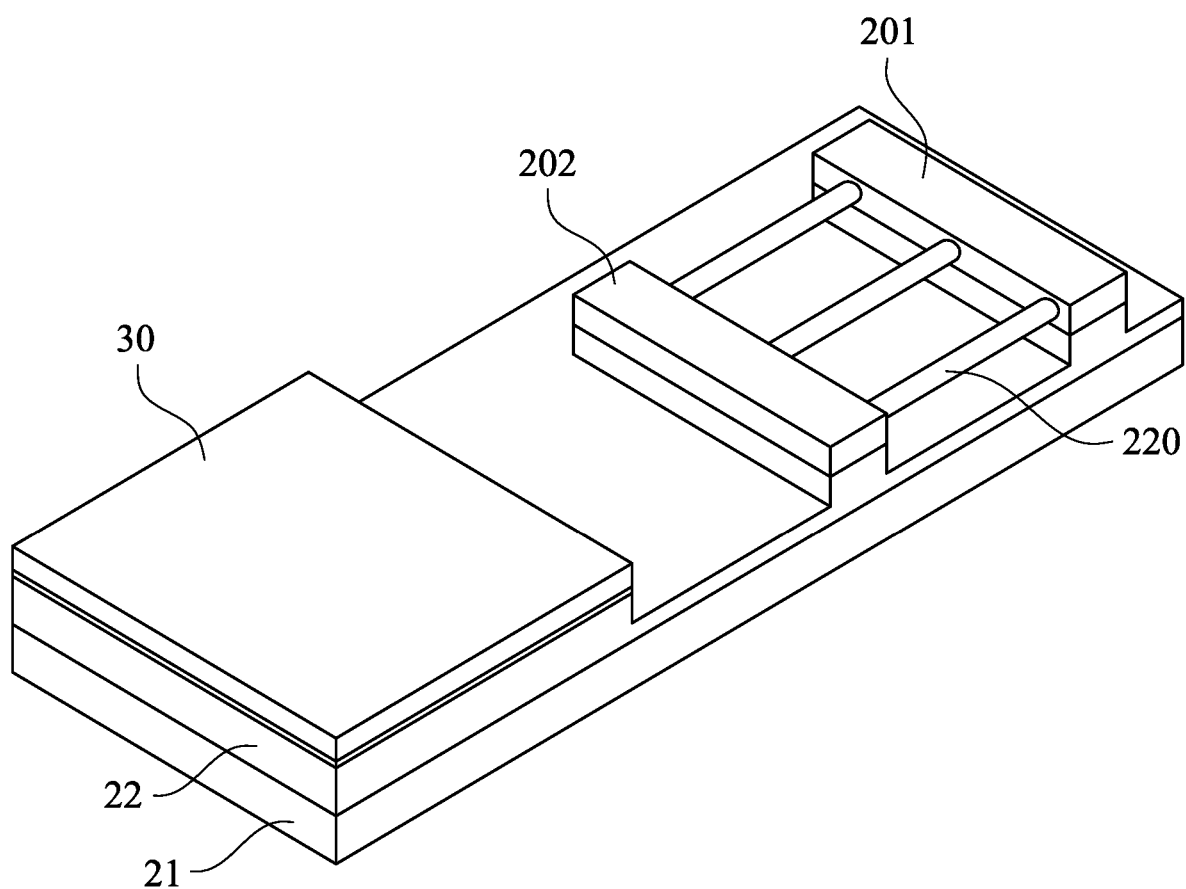

As shown in FIG. 29, each connecting structure 211 is partially removed to form the first nanowire 220. In some embodiments, the lower portions of the connecting structures 211 and underlying portions of the BOX layer 22 are removed by an isotropic etching process, so that the first nanowires 220 are formed as suspended between the pads 201 and 202. The isotropic etching is a form of etching that does not include a preferential direction. One example of an isotropic etching is wet etching. The isotropic etching process forms undercut regions that the first nanowires 220 are suspended over. In some embodiments, the isotropic etching may be performed using a diluted hydrofluoric acid (DHF). After the isotropic etching process, the first nanowires 220 may be smoothed to form elliptical shaped (and in some cases, cylindrical shaped) structures. In some embodiments, the smoothing process may be performed by an annealing process. Example annealing temperature may range from about 600° C. to about 1000° C., and the hydrogen pressure in the annealing process may range from about 7 ton to about 600 torr. After formation of the first nanowires 220, the mask 42 can be removed to expose the epitaxial structure 30. An exemplary method of removing the mask 42 is wet etching which is able to selectively remove silicon nitride, and this wet etching utilizes hot (approximately 145° C.-180° C.) phosphoric acid ($H_3PO_4$) solutions with water.

Figure 30:
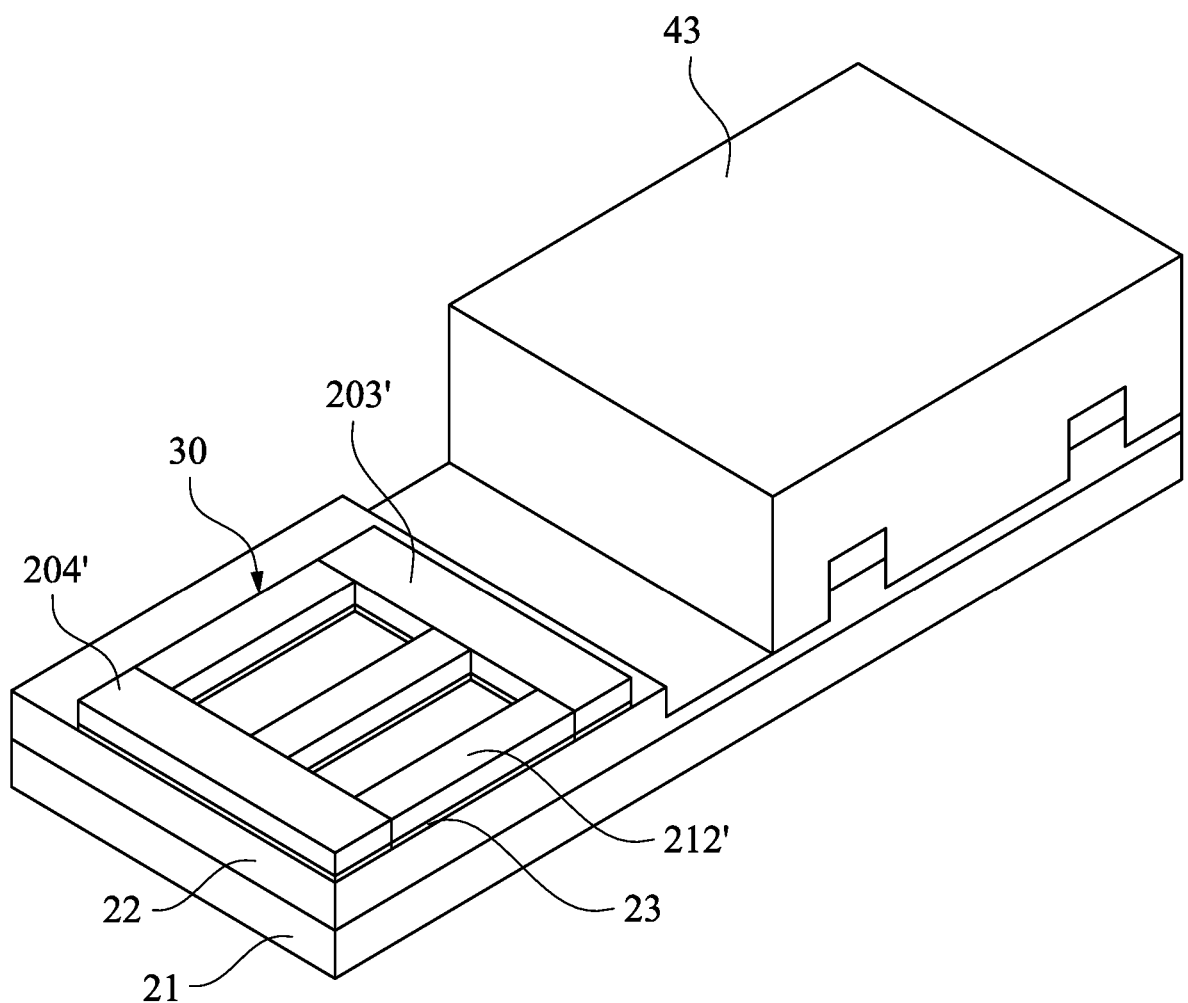

As shown in FIG. 30, the pads 201 and 202 and the first nanowires 220 are covered by a mask 43, while the epitaxial structure 30 is exposed by the mask 43. The epitaxial structure 30 and an underlying portion of the SOI layer 23 are patterned to form pads 203' and 204' and connecting structures 212'. For example, the pads 203' and 204', and the connecting structures 212' may be fabricated by using suitable processes such as photolithography and etch. The connecting structures 212' connect the pads 203' and 204'. In other words, each connecting structure 212' may have separate pads 203' and 204' on opposite sides thereof. The mask 43 may be a hard mask, such as silicon nitride ($Si_3N_4$), which has relatively high etching resistivity compared to the epitaxial structure 30.

Figure 31:
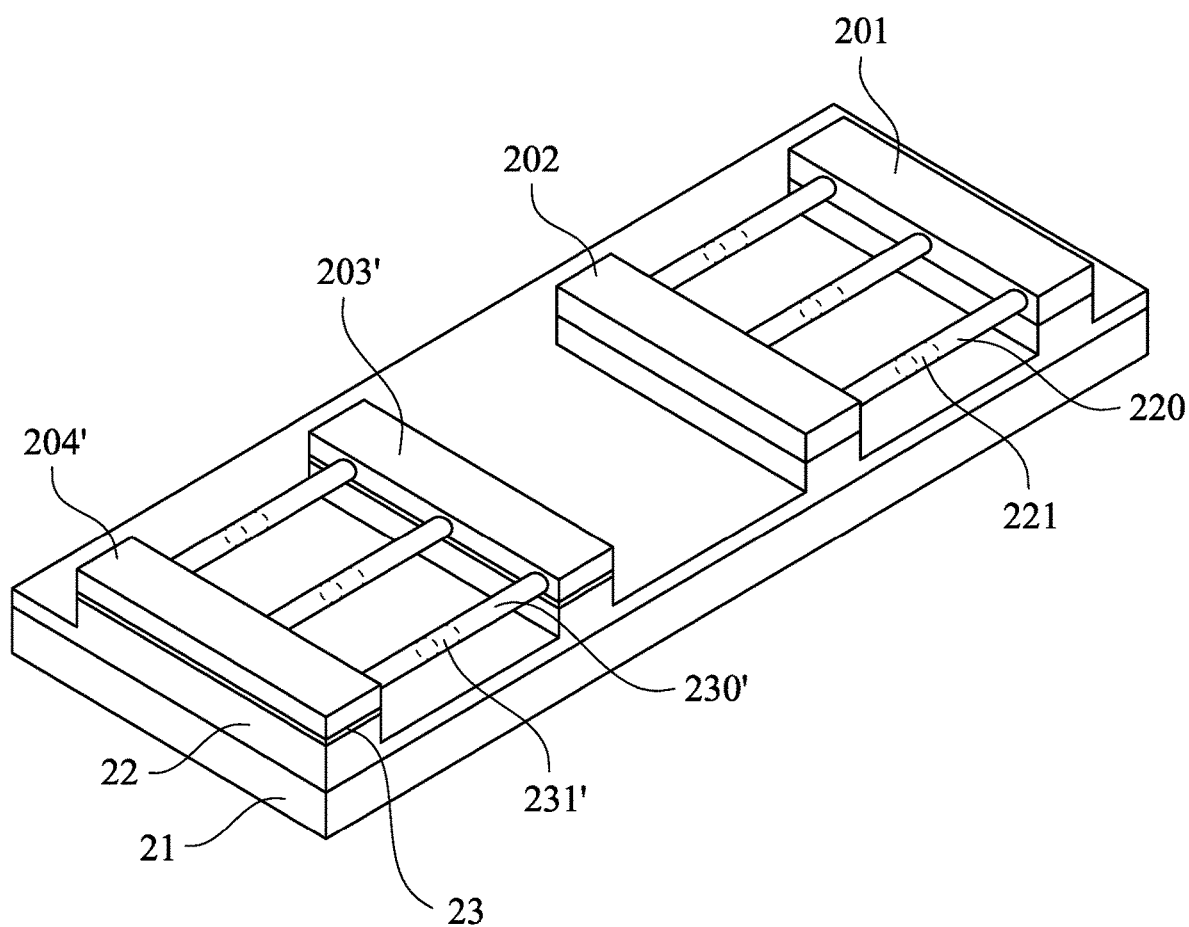

As shown in FIG. 31, each connecting structure 212' is partially removed to form the second nanowire 230'. In some embodiments, the lower portions of the connecting structures 212' and underlying portions of the BOX layer 22 are removed by an isotropic etching process, so that the second nanowires 230' are formed as suspended between the pads 203' and 204'. The isotropic etching is a form of etching that does not include a preferential direction. One example of an isotropic etching is wet etching. The isotropic etching process forms undercut regions that the second nanowires 230' are suspended over. In some embodiments, the isotropic etching may be performed using a diluted hydrofluoric acid (DHF). After the isotropic etching process, the second nanowires 230' may be smoothed to form elliptical shaped (and in some cases, cylindrical shaped) structures. In some embodiments, the smoothing process may be performed by an annealing process. Example annealing temperature may range from about 600° C. to about 1000° C., and the hydrogen pressure in the annealing process may range from about 7 ton to about 600 torr. After formation of the second nanowires 230', the mask 43 can be removed. An exemplary method of removing the mask 43 is wet etching which is able to selectively remove silicon nitride, and this wet etching utilizes hot (approximately 145° C.-180° C.) phosphoric acid ($H_3PO_4$) solutions with water.

Portions of the first nanowires 220 may serve as n-channels 221 for an n-type nanowire FET. Portions of the second nanowires 230' may serve as p-channels 231' for a p-type nanowire FET. Since the first nanowires 220, formed from the SOI layer 23, and the second nanowires 230', formed from the epitaxial structure 30, are made of different materials, the n-channels 221 and the p-channels 231' are made of different materials. In particular, the n-channels 221 may be made of silicon, while the p-channels 231' may be made of silicon germanium. Because germanium shifts the valence band of the p-channels 231', the germanium concentration (or the germanium atomic percentage) of the p-channels 231' may be controlled to tune the threshold voltage of the p-type nanowire FET. Control of the germanium concentration may be implemented by the ratio of the flow rate of the germanium-containing gases to the flow rate of the silicon-containing gases during epitaxy growth of the epitaxial structure 30.

Afterwards, the method continues with forming dummy gate material layers on the first and second nanowires 220 and 230', patterning the dummy gate material layers, forming spacers on opposite sidewalls of the dummy gate material layers, forming source/drain extention regions in portions of first and second nanowires 220 and 230' not covered by the spacers and the dummy gate material layers, forming deep source/drain regions in the pads 201, 202, 203' and 204', forming an ILD layer to cover the dummy gate material layers, and the first and second nanowires 220 and 230', removing a portion of the ILD layer to expose top surface of the dummy gate material layers, removing the dummy gate material layers to form recesses, forming an interfacial layer in the recesses to cover the first and second nanowires 220 and 230', forming a gate dielectric layer on the interfacial layer, forming a cap layer on the gate dielectric layer, forming a work function metal layer on the cap layer, forming a metal gate on the work function metal layer, and removing the excess metal gate and excess work function metal layer outside the recesses. These steps can be referred to FIG. 18 to FIG. 22.

In some embodiments, the recess R2 in FIG. 26 can be formed after the first nanowires 210 are formed, and then, the epitaxial structure 30 can be formed. In other words, during the processes of forming the first nanowires 210, such as steps performed in FIG. 28 and FIG. 29, no epitaxial structure is present on the SOI layer 23. After formation of the first nanowires 210, the first nanowires 210 can be protected by a mask, such as a hard mask, and a portion of the SOI layer 23 can be removed to form the recess R2. Afterwards, the epitaxial structure 30 can be formed in the recess R2 and can be sequentially processed to form pads 203' and 204' and the second nanowires 230'. After formation of the second nanowires 230', the hard mask protecting the first nanowires 210 can be removed by wet etching.

The FinFETs and nanowire FETs and formation methods thereof shown above are exemplary, not limiting the present disclosure. The foregoing materials of the channels, the cap layers, and the metal gate electrodes, and the gate dielectric layers can be applied on other multigate semiconductor devices as well, such as the trigate FETs, the pi-gate or omega-gate FETs. In the foregoing embodiments, the desired threshold voltages of the n-type and p-type FETs can be achieved by adjusting the dopant concentration in the cap layers of the n-type and p-type FETs and the germanium concentration in the p-type channel. Moreover, since the desired threshold voltages of the n-type and p-type FETs are achieved by such dopant concentration and germanium concentration, the metal gate electrodes of the n-type and p-type FETs can be made of substantially the same material.

According to some embodiments, a semiconductor device includes a first nanowire structure, a second nanowire structure, a first annular hafnium oxide layer, a second annular hafnium oxide layer, a first annular cap layer, a second annular cap layer, a first metal gate electrode and a second metal gate electrode. The first nanowire structure is suspended over a substrate and has an n-channel region. The second nanowire structure is suspended over the substrate and has a p-channel region. The first annular hafnium oxide layer encircles the n-channel region. The second annular hafnium oxide layer encircles the p-channel region. The first annular cap layer encircles the first annular hafnium oxide layer. The second annular cap layer encircles the second annular hafnium oxide layer. The first and second annular cap layers are made of a same material that is lanthanum oxide, yttrium oxide, or strontium oxide. The first metal gate electrode encircles the first annular cap layer. The second metal gate electrode encircles the second annular cap layer. The first and second metal gate electrodes have a same metal composition.

According to some embodiments, a semiconductor device includes a first nanowire structure, a second nanowire structure, a first ring-shaped hafnium oxide layer, a second ring-shaped hafnium oxide layer, a first metal gate electrode and a second metal gate electrode. The first nanowire structure extends in parallel with a substrate and spaced apart from the substrate. The first nanowire structure has a silicon (Si) channel region. The second nanowire structure extends in parallel with the substrate and spaced apart from the substrate. The second nanowire structure has a silicon germanium (SiGe) channel region. The first ring-shaped hafnium oxide layer encircles the Si channel region. The second ring-shaped hafnium oxide layer encircles the SiGe channel region. Both the first and second ring-shaped hafnium oxide layers are doped with lanthanum, yttrium, or strontium. The first metal gate electrode encircles the first ring-shaped hafnium oxide layer. The second metal gate electrode encircles the second ring-shaped hafnium oxide layer. The first and second metal gate electrodes have a same metal composition.

According to some embodiments, a semiconductor device includes a Si channel region, a SiGe channel region, a first hafnium oxide layer, a second hafnium oxide layer, a first cap layer, a second cap layer, a first work function metal and a second work function metal. The Si channel region is suspended over a substrate. The SiGe channel region is suspended over the substrate. The first hafnium oxide layer forms a closed-loop ring enclosing the Si channel region. The second hafnium oxide layer forms a closed-loop ring enclosing the SiGe channel region. The first cap layer forms a closed-loop ring enclosing the first hafnium oxide layer. The second cap layer forms a closed-loop ring enclosing the second hafnium oxide layer. The first and second cap layers are made lanthanum oxide, yttrium oxide, or strontium oxide. The first work function metal forms a closed-loop ring enclosing the first cap layer. The second work function metal forms a closed-loop ring enclosing the second cap layer. The first and second work function metals have a same metal composition.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first nanowire structure suspended over a substrate and having an n-channel region;
a second nanowire structure suspended over the substrate and having a p-channel region;
a first gate dielectric contacting the n-channel region, and comprising a first annular hafnium oxide layer encircling the n-channel region and a first annular cap layer encircling the first annular hafnium oxide layer;
a second gate dielectric contacting the p-channel region, and comprising a second annular hafnium oxide layer encircling the p-channel region and a second annular cap layer encircling the second annular hafnium oxide layer, the first and second annular cap layers being made of a same material that is lanthanum oxide, yttrium oxide, or strontium oxide;
a first metal gate electrode encircling and contacting the first annular cap layer of the first gate dielectric; and
a second metal gate electrode encircling and contacting the second annular cap layer of the second gate dielectric, wherein the first and second metal gate electrodes have a same work function metal composition, and the first and second gate dielectrics have a same dielectric composition.

2. The semiconductor device of claim 1, wherein the first metal gate electrode and the second metal gate electrode both include a p-work function metal.

3. The semiconductor device of claim 1, wherein the first metal gate electrode comprises a p-work function metal layer encircling and contacting the first annular cap layer.

4. The semiconductor device of claim 1, wherein the second metal gate electrode comprises a p-work function metal layer encircling and contacting the second annular cap layer.

5. The semiconductor device of claim 1, wherein the first metal gate electrode comprises an annular layer of binary compound of titanium and nitrogen encircling and contacting the first annular cap layer.

6. The semiconductor device of claim 5, wherein the first metal gate electrode comprises an outermost metal structure encircling and contacting the annular layer of binary compound of titanium and nitrogen, and the outermost metal structure extends along a direction perpendicular to a longitudinal axis of the first nanowire structure.

7. The semiconductor device of claim 1, wherein the second metal gate electrode comprises an annular layer of binary compound of titanium and nitrogen encircling and contacting the second annular cap layer.

8. The semiconductor device of claim 7, wherein the second metal gate electrode comprises an outermost metal structure encircling and contacting the annular layer of binary compound of titanium and nitrogen, and the outermost metal structure extends along a direction perpendicular to a longitudinal axis of the first nanowire structure.

9. The semiconductor device of claim 1, further comprising:
a pair of gate spacers extending along opposite sidewalls of the first metal gate electrode, wherein the first nanowire structure extends through the pair of gate spacers.

10. The semiconductor device of claim 1, further comprising:
a pair of gate spacers extending along opposite sidewalls of the second metal gate electrode, wherein the second nanowire structure extends through the pair of gate spacers.

11. A semiconductor device, comprising:
a first nanowire structure extending in parallel with a substrate and spaced apart from the substrate, the first nanowire structure having a silicon (Si) channel region;
a second nanowire structure extending in parallel with the substrate and spaced apart from the substrate, the second nanowire structure having a silicon germanium (SiGe) channel region;
a first gate dielectric contacting the Si channel region and comprising a first ring-shaped hafnium oxide layer encircling the Si channel region;
a second gate dielectric contacting the SiGe channel region and comprising a second ring-shaped hafnium oxide layer encircling the SiGe channel region, wherein both the first and second ring-shaped hafnium oxide layers are doped with lanthanum, yttrium, or strontium;

a first metal gate electrode encircling and contacting the first gate dielectric; and a second metal gate electrode encircling and contacting the second gate dielectric, wherein the first and second metal gate electrodes have a same work function metal composition, and the first and second gate dielectrics have a same dielectric composition.

12. The semiconductor device of claim 11, wherein the first metal gate electrode comprises a ring-shaped layer of binary compound of titanium and nitrogen encircling the first ring-shaped hafnium oxide layer.

13. The semiconductor device of claim 12, wherein the first gate dielectric further comprises:
an oxide layer of lanthanum, yttrium, or strontium between the ring-shaped layer of binary compound of titanium and nitrogen and the first ring-shaped hafnium oxide layer.

14. The semiconductor device of claim 11, wherein the second metal gate electrode comprises a ring-shaped layer of binary compound of titanium and nitrogen encircling the second ring-shaped hafnium oxide layer.

15. The semiconductor device of claim 14, wherein the second gate dielectric further comprises:
an oxide layer of lanthanum, yttrium, or strontium between the ring-shaped layer of binary compound of titanium and nitrogen and the second ring-shaped hafnium oxide layer.

16. The semiconductor device of claim 11, wherein the second nanowire structure comprises a silicon nanowire and an epitaxial SiGe sheath formed around the silicon nanowire having the SiGe channel region.

17. A semiconductor device, comprising:
a silicon (Si) channel region suspended over a substrate;
a silicon germanium (SiGe) channel region suspended over the substrate;
a first gate dielectric comprising a first hafnium oxide layer forming a closed-loop ring enclosing the Si channel region, and a first cap layer forming a closed-loop ring enclosing the first hafnium oxide layer;
a second gate dielectric comprising a second hafnium oxide layer forming a closed-loop ring enclosing the SiGe channel region, and a second cap layer forming a closed-loop ring enclosing the second hafnium oxide layer, wherein the first and second cap layers are made lanthanum oxide, yttrium oxide, or strontium oxide;
a first work function metal forming a closed-loop ring enclosing and contacting the first cap layer of the first gate dielectric; and
a second work function metal forming a closed-loop ring enclosing and contacting the second cap layer of the second gate dielectric, wherein the first and second work function metals have a same metal composition, and the first and second gate dielectrics have a same number of layers.

18. The semiconductor device of claim 17, wherein both the first work function metal and the second work function metal are a binary compound of titanium and nitrogen.

19. The semiconductor device of claim 17, wherein both the first work function metal and the second work function metal are a p-work function metal.

20. The semiconductor device of claim 17, further comprising:
a silicon nanowire encircled by the SiGe channel region.

* * * * *